(12) United States Patent
Vyatskikh et al.

(10) Patent No.: US 11,442,362 B2
(45) Date of Patent: Sep. 13, 2022

(54) ADDITIVE MANUFACTURING OF ARCHITECTURED MATERIALS

(71) Applicant: California Institute of Technology, Pasadena, CA (US)

(72) Inventors: Andrey Vyatskikh, Irvine, CA (US); Stephane J. Delalande, Longpont sur Orge (FR); Julia R. Greer, San Marino, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/669,379

(22) Filed: Oct. 30, 2019

(65) Prior Publication Data

US 2020/0073236 A1 Mar. 5, 2020

Related U.S. Application Data

(62) Division of application No. 15/719,338, filed on Sep. 28, 2017, now abandoned.

(60) Provisional application No. 62/401,039, filed on Sep. 28, 2016.

(51) Int. Cl.
| | | |
|---|---|---|
| *G03F 7/004* | (2006.01) |
| *G03F 7/40* | (2006.01) |
| *G03F 7/20* | (2006.01) |
| *G03F 7/00* | (2006.01) |
| *G03F 7/027* | (2006.01) |
| *B33Y 10/00* | (2015.01) |

(52) U.S. Cl.
CPC .......... *G03F 7/0042* (2013.01); *G03F 7/0037* (2013.01); *G03F 7/0043* (2013.01); *G03F 7/027* (2013.01); *G03F 7/2053* (2013.01); *G03F 7/40* (2013.01); *B33Y 10/00* (2014.12)

(58) Field of Classification Search
CPC ........ G03F 7/0042; G03F 7/2053; G03F 7/40; B33Y 10/00
See application file for complete search history.

(56) References Cited

U.S. PATENT DOCUMENTS

2018/0015436 A1* 1/2018 Chandrasekaran ..... C01B 13/18

OTHER PUBLICATIONS

Chemov et al., "Thermal polymerization of Cobalt (II) and Nickel (II) Acrylates: Use of In Situ Dielectric Measurements", Polymer Science, Ser. A. 2007, vol. 49, No. 3, pp. 267-274.

* cited by examiner

*Primary Examiner* — Andrew J. Oyer
(74) *Attorney, Agent, or Firm* — Gavrilovich, Dodd & Lindsey LLP

(57) ABSTRACT

This disclosure provides a scalable and reproducible process to create complex 3D metal materials with sub-micron features by applying lithographic methods to transparent metal- or inorganic-rich polymer resins.

10 Claims, 15 Drawing Sheets

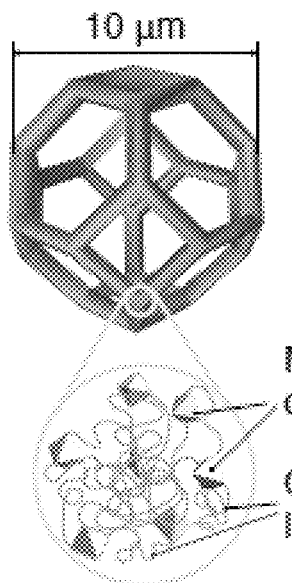
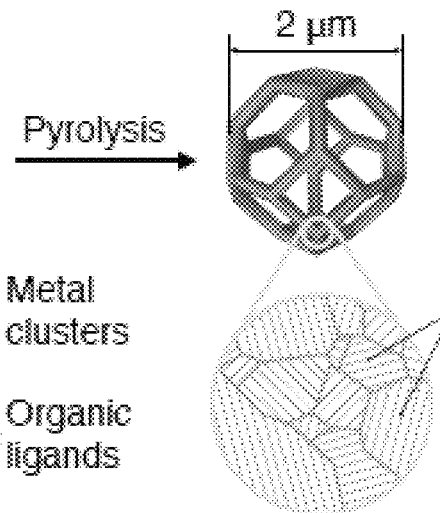
FIG. 1D  FIG. 1E
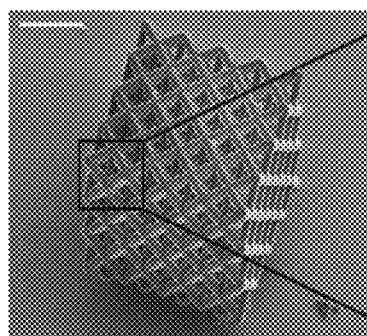
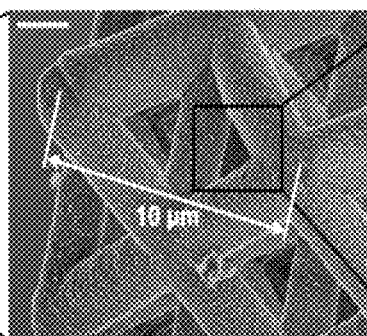
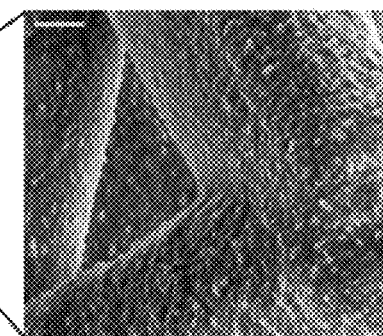
FIG. 1F  FIG. 1G  FIG. 1H
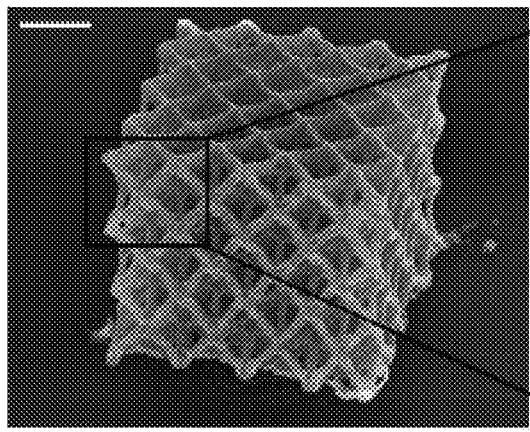
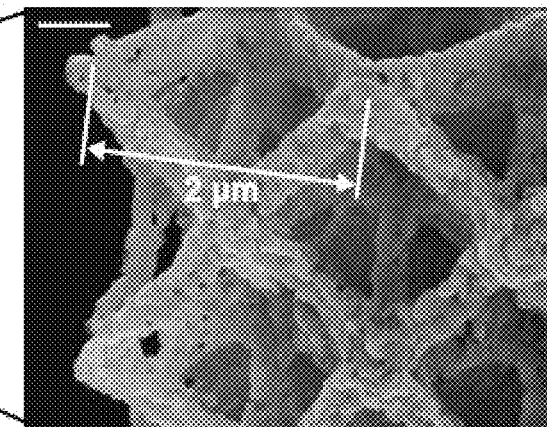
FIG. 1I  FIG. 1J

ADDITIVE MANUFACTURING OF ARCHITECTURED MATERIALS

CROSS REFERENCE TO RELATED APPLICATIONS

This application is a divisional application and claims priority to U.S. application Ser. No. 15/719,338, filed Sep. 28, 2017, which application claims the benefit of U.S. Provisional Patent Application No. 62/401,039, filed Sep. 28, 2016, all of which are incorporated herein in by reference in their entirety for any and all purposes.

STATEMENT REGARDING FEDERALLY SPONSORED RESEARCH

This invention was made with government support under Grant No. N00014-16-1-2827 awarded by the Office of Naval Research. The government has certain rights in the invention.

FIELD

The invention relates to methods of manufacturing micro- and nano-scaled materials.

BACKGROUND

Methods for additive manufacturing (AM) of metals are limited to 20-50 μm resolution, which renders them inapplicable for generating complex 3D-printed metals with smaller features. Efforts have been devoted to fabricating metal structures with smaller dimensions; today no established 3D-printing of metals exists at the micron scale.

SUMMARY

The disclosure provides a lithography-based process to create complex 3D nano- and/or micro-architected materials comprising metals, metal ions, metalloids, inorganic, and inorganic-organic hybrid materials ("framework materials") with about 5 to 100 nm resolution. The process uses a photopolymerizable resist containing the framework material. The process uses, for example, a two-photon lithography technique to sculpt 3D polymer scaffolds. These scaffolds can then be heat treated (e.g., pyrolyzed) to volatilize any organics, thereby leaving the framework material in a desired architectural format. Using the method, the disclosure provides the ability to produce 3D-printed micro- and nano-architected material including, for example, metal frameworks and structures.

The disclosure provides a composition comprising a hybrid organic-inorganic polymer resin comprising photopolymerizable functional groups having the general structure:

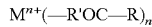

where M is a metal, a metal ion, a metalloid, a metal alloy, a metal oxide, a metal nitride, an inorganic, a metal-inorganic composite, a carbon-based material and/or an inorganic-organic hybrid material, wherein R is an alkene or a $C_{2-10}$ terminal alkene and R' is N, O, F, S or Cl and wherein n is 1, 2, 3, 4, 5 or 6. In one embodiment, the hybrid organic-inorganic polymer resin has the formula R—COR'—$M^{2+}$—R'OC—R, wherein M is a divalent metal ion, alloy, or inorganic material, R is an alkene or $C_{2-10}$ terminal alkene and R' is N, O, F, S or Cl. In another embodiment, the metal ion is selected from the group consisting of $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Sc^{3+}$, $Sc^{2+}$, $Sc^+$, $Y^{3+}$, $Y^{2+}$, $Y^+$, $Ti^{4+}$, $Ti^{3+}$, $Ti^{2+}$, $Zr^{4+}$, $Zr^{3+}$, $Zr^{2+}$, $Hf^{4+}$, $Hf^{3+}$, $V^{5+}$, $V^{4+}$, $V^{3+}$, $V^{2+}$, $Nb^{5+}$, $Nb^{4+}$, $Nb^{3+}$, $Nb^{2+}$, $Ta^{5+}$, $Ta^{4+}$, $Ta^{3+}$, $Ta^{2+}$, $Cr^{6+}$, $Cr^{5+}$, $Cr^{4+}$, $Cr^{3+}$, $Cr^{2+}$, $Cr^+$, Cr, $Mo^{6+}$, $Mo^{5+}$, $Mo^{4+}$, $Mo^{3+}$, $Mo^{2+}$, $Mo^+$, Mo, $W^{6+}$, $W^{5+}$, $W^{4+}$, $W^{3+}$, $W^{2+}$, $W^+$, W, $Mn^{7+}$, $Mn^{6+}$, $Mn^{5+}$, $Mn^{4+}$, $Mn^{3+}$, $Mn^{2+}$, $Mn^+$, $Re^{7+}$, $Re^{6+}$, $Re^{5+}$, $Re^{4+}$, $Re^{3+}$, $Re^{2+}$, $Re^+$, Re, $Fe^{6+}$, $Fe^{4+}$, $Fe^{3+}$, $Fe^{2+}$, $Fe^+$, Fe, $Ru^{8+}$, $Ru^{7+}$, $Ru^{6+}$, $Ru^{4+}$, $Ru^{3+}$, $Ru^{2+}$, $Os^{8+}$, $Os^{7+}$, $Os^{6+}$, $Os^{5+}$, $Os^{4+}$, $Os^{3+}$, $Os^{2+}$, $Os^+$, Os, $Co^{5+}$, $Co^{4+}$, $Co^{3+}$, $Co^{2+}$, $Co^+$, $Rh^{6+}$, $Rh^{5+}$, $Rh^{4+}$, $Rh^{3+}$, $Rh^{2+}$, $Rh^+$, $Ir^{6+}$, $Ir^{5+}$, $Ir^{4+}$, $Ir^{3+}$, $Ir^{2+}$, $Ir^+$, Ir, $Ni^{3+}$, $Ni^{2+}$, $Ni^+$, Ni, $Pd^{6+}$, $Pd^{4+}$, $Pd^{2+}$, $Pd^+$, Pd, $Pt^{6+}$, $Pt^{5+}$, $Pt^{4+}$, $Pt^{3+}$, $Pt^{2+}$, $Pt^+$, $Cu^{4+}$, $Cu^{3+}$, $Cu^{2+}$, $Cu^+$, $Ag^{3+}$, $Ag^{2+}$, $Ag^+$, $Au^{5+}$, $Au^{4+}$, $Au^{3+}$, $Au^{2+}$, $Au^+$, $Zn^{2+}$, $Zn^+$, Zn, $Cd^{2+}$, $Cd^+$, $Hg^{4+}$, $Hg^{2+}$, $Hg^+$, $B^{3+}$, $B^{2+}$, $B^+$, $Al^{3+}$, $Al^{2+}$, $Al^+$, $Ga^{3+}$, $Ga^{2+}$, $Ga^+$, $In^{3+}$, $In^{2+}$, $In^{1+}$, $Tl^{3+}$, $Tl^+$, $Si^{4+}$, $Si^{3+}$, $Si^{2+}$, $Si^+$, $Ge^{4+}$, $Ge^{3+}$, $Ge^{2+}$, $Ge^+$, Ge, $Sn^{4+}$, $Sn^{2+}$, $Pb^{4+}$, $Pb^{2+}$, $As^{5+}$, $As^{3+}$, $As^{2+}$, $As^+$, $Sb^{5+}$, $Sb^{3+}$, $Bi^{5+}$, $Bi^{3+}$, $Te^{6+}$, $Te^{5+}$, $Te^{4+}$, $Te^{2+}$, $La^{3+}$, $La^{2+}$, $Ce^{4+}$, $Ce^{3+}$, $Ce^{2+}$, $Pr^{4+}$, $Pr^{3+}$, $Pr^{2+}$, $Nd^{3+}$, $Nd^{2+}$, $Sm^{3+}$, $Sm^{2+}$, $Eu^{3+}$, $Eu^{2+}$, $Gd^{3+}$, $Gd^{2+}$, $Gd^+$, $Tb^{4+}$, $Tb^{3+}$, $Tb^{2+}$, $Tb^+$, $Db^{3+}$, $Db^{2+}$, $Ho^{3+}$, $Er^{3+}$, $Tm^{4+}$, $Tm^{3+}$, $Tm^{2+}$, $Yb^{3+}$, $Yb^{2+}$, $Lu^{3+}$ and alloys of any of the foregoing. In another embodiment, the inorganic is a single or mixed oxide, carbide, nitride, silicate, boride of Ti, W, Si, Zr, Al, Y, Cr, Fe, Pb, Co, Ce, Zn, or a rare earth element. In another embodiment, the inorganic material is selected from the group consisting of $TiO_2$, $AlO_2$, $Al_2O_3$, $ZrO_2$, SiC, $SiO_2$, SiC, $CeO_2$, and ZnO. In another embodiment, the metal-inorganic composite material comprises Au—Ni—$TiO_2$, Ni—Co—$TiO_2$, Ni—Zn—$Al_2O_3$, or Ni—B—$TiO_2$. In another embodiment, of any of the foregoing, the composition further comprises a photoinitiator or a photoinitiator and a monomer capable of forming a polymer with the hybrid organic-inorganic polymer.

The disclosure also provides a method for manufacturing a sub-micron architectural material, comprising patterning a hybrid organic-inorganic polymer resin comprising photopolymerizable functional groups having the general structure:

$$M^{n+}(-R'OC-R)_n$$

where M is a metal, a metal ion, a metalloid, a metal alloy, a metal oxide, a metal nitride, an inorganic, an inorganic-organic hybrid a carbon-based material and/or a metal-inorganic composite material, wherein R is an alkene or $C_{2-10}$ terminal alkene and R' is N, O, F, S or Cl and wherein n is 1, 2, 3, 4, 5 or 6, wherein the patterning occurs in the presence of a photoinitiator using a single or two photon lithography technique to polymerize the polymer resin and generate the sub-micron architectural material having desired characteristic dimension of about 5 nm to 5 microns across. In one embodiment, the hybrid organic-inorganic polymer resin has the formula R—COR'-$M^{2+}$—R'OC—R, wherein M is a divalent metal ion, alloy, or inorganic material, R is an alkene or a $C_{2-10}$ terminal alkene and R' is N, O, F, S or Cl. In another embodiment, the metal ion is selected from the group consisting of $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Sc^{3+}$, $Sc^{2+}$, $Sc^+$, $Y^{3+}$, $Y^{2+}$, $Y^+$, $Ti^{4+}$, $Ti^{3+}$, $Ti^{2+}$, $Zr^{4+}$, $Zr^{3+}$, $Zr^{2+}$, $Hf^{4+}$, $Hf^{3+}$, $V^{5+}$, $V^{4+}$, $V^{3+}$, $V^{2+}$, $Nb^{5+}$, $Nb^{4+}$, $Nb^{3+}$, $Nb^{2+}$, $Ta^{5+}$, $Ta^{4+}$, $Ta^{3+}$, $Ta^{2+}$, $Cr^{6+}$, $Cr^{5+}$, $Cr^{4+}$, $Cr^{3+}$, $Cr^{2+}$, $Cr^+$, Cr, $Mo^{6+}$, $Mo^{5+}$, $Mo^{4+}$, $Mo^{3+}$, $Mo^{2+}$, $Mo^+$, Mo, $W^{6+}$, $W^{5+}$, $W^{4+}$, $W^{3+}$, $W^{2+}$, $W^+$, W, $Mn^{7+}$, $Mn^{6+}$, $Mn^{5+}$, $Mn^{4+}$, $Mn^{3+}$, $Mn^{2+}$, $Mn^+$, $Re^{7+}$, $Re^{6+}$, $Re^{5+}$, $Re^{4+}$, $Re^{3+}$, $Re^{2+}$, $Re^+$, Re, $Fe^{6+}$, $Fe^{4+}$, $Fe^{3+}$, $Fe^{2+}$, $Fe^+$, Fe, $Ru^{8+}$, $Ru^{7+}$, $Ru^{6+}$, $Ru^{4+}$, $Ru^{3+}$, $Ru^{2+}$, $Os^{8+}$, $Os^{7+}$, $Os^{6+}$, $Os^{5+}$, $Os^{4+}$, $Os^{3+}$, $Os^{2+}$, $Os^+$, Os, $Co^{5+}$, $Co^{4+}$, $Co^{3+}$, $Co^{2+}$, $Co^+$, $Rh^{6+}$, $Rh^{5+}$, $Rh^{4+}$, $Rh^{3+}$, $Rh^{2+}$, $Rh^+$, $Ir^{6+}$, $Ir^{5+}$, $Ir^{4+}$, $Ir^{3+}$, $Ir^{2+}$, Ir$^+$, Ir, Ni$^{3+}$, Ni$^{2+}$, Ni$^+$, Ni, Pd$^{6+}$, Pd$^{4+}$, Pd$^{2+}$, Pd$^+$, Pd, Pt$^{6+}$, Pt$^{5+}$, Pt$^{4+}$, Pt$^{3+}$, Pt$^{2+}$, Pt$^+$, Cu$^{4+}$, Cu$^{3+}$, Cu$^{2+}$, Cu$^+$, Ag$^{3+}$, Ag$^{2+}$, Ag$^+$, Au$^{5+}$, Au$^{4+}$, Au$^{3+}$, Au$^{2+}$, Au$^+$, Zn$^{2+}$, Zn$^+$, Zn, Cd$^{2+}$, Cd$^+$, Hg$^{4+}$, Hg$^{2+}$, Hg$^+$, B$^{3+}$, B$^{2+}$, B$^+$, Al$^{3+}$, Al$^{2+}$, Al$^+$, Ga$^{3+}$, Ga$^{2+}$, Ga$^+$, In$^{3+}$, In$^{2+}$, In$^{1+}$, Tl$^{3+}$, Tl$^+$, Si$^{4+}$, Si$^{3+}$, Si$^{2+}$, Si$^+$, Ge$^{4+}$, Ge$^{3+}$, Ge$^{2+}$, Ge$^+$, Ge, Sn$^{4+}$, Sn$^{2+}$, Pb$^{4+}$, Pb$^{2+}$, As$^{5+}$, As$^{3+}$, As$^{2+}$, As$^+$, Sb$^{5+}$, Sb$^{3+}$, Bi$^{5+}$, Bi$^{3+}$, Te$^{6+}$, Te$^{5+}$, Te$^{4+}$, Te$^{2+}$, La$^{3+}$, La$^{2+}$, Ce$^{4+}$, Ce$^{3+}$, Ce$^{2+}$, Pr$^{4+}$, Pr$^{3+}$, Pr$^{2+}$, Nd$^{3+}$, Nd$^{2+}$, Sm$^{3+}$, Sm$^{2+}$, Eu$^{3+}$, Eu$^{2+}$, Gd$^{3+}$, Gd$^{2+}$, Gd$^+$, Tb$^{4+}$, Tb$^{3+}$, Tb$^{2+}$, Tb$^+$, Db$^{3+}$, Db$^{2+}$, Ho$^{3+}$, Er$^{3+}$, Tm$^{4+}$, Tm$^{3+}$, Tm$^{2+}$, Yb$^{3+}$, Yb$^{2+}$, Lu$^{3+}$ and alloys of any of the foregoing. In another embodiment, the inorganic is a single or mixed oxide, carbide, nitride, silicate, boride of Ti, W, Si, Zr, Al, Y, Cr, Fe, Pb, Co, or a rare earth element. In another embodiment, the inorganic is selected from the group consisting of $TiO_2$, $AlO_2$, $Al_2O_3$, $ZrO_2$, SiC, $SiO_2$, SiC, $CeO_2$, and ZnO. In still another embodiment, the metal-inorganic composite comprises Au—Ni—$TiO_2$, Ni—Co—$TiO_2$, Ni—Zn—$Al_2O_3$, or Ni—B—$TiO_2$. The method can further comprise removing non-polymerized resin. The method can yet further comprise, or alternatively comprise, pyrolizing the sub-micron architectural material to remove organic material. In one embodiment, the pyrolizing comprises a two-step pyrolysis technique to remove organic material followed by removing oxygen. In another embodiment, the sub-micron architectural material comprises a metal, a metalloid and/or an inorganic structure having a dimension across an axis of a metal, a metalloid and/or an inorganic material strut, beam or joint of less than 1 micron.

The disclosure also provides a device comprising the sub-micron architectural material made by a method of the disclosure wherein the device comprises a metal, a metalloid, and/or an inorganic scaffold that is free of organic material having a strut, beam or joint cross axis dimension (e.g., a radial dimension) of less than 1 micron. In one embodiment, the device comprises titania. In another embodiment, the device is an electrode, photocell, filter, circuit, water purification device or nanocage.

BRIEF DESCRIPTION OF THE FIGURES

FIG. 1A-J shows a process for nanoscale additive manufacturing of metals and SEM characterization of the fabricated samples. (A) Ligand exchange reaction used to synthesize metal precursor with cross-linking functionality. (B) Metal precursor, acrylic resin, and photoinitiator are mixed to form a transparent metal-containing photoresist. (C) Schematic of two-photon lithography (TPL) process used to sculpt the scaffold. (D) Schematic of fabrication of metal-containing polymer part that is (E) pyrolyzed to remove organic content and to convert the polymer into a metal. SEM images of (F-H) a representative octet lattice made out of a nickel-containing polymer at different magnifications and (I), (J) a representative nickel nanolattice after pyrolysis. Magnifications in (G) and (I) (scale bars 2 μm) and also (H) and (J) (scale bars 500 nm) are identical. Scale bar is 15 μm for (F).

DETAILED DESCRIPTION

Figure 1A:
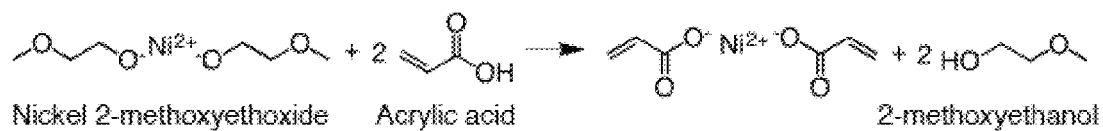

As used herein and in the appended claims, the singular forms "a," "an," and "the" include plural referents unless the context clearly dictates otherwise. Thus, for example, reference to "a photoinitiator" includes a plurality of such photoinitiators and reference to "the metal" includes reference to one or more metals, and so forth.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Any publications discussed above and throughout the text are provided solely for their disclosure prior to the filing date of the present application. Nothing herein is to be construed as an admission that the inventors are not entitled to antedate such disclosure by virtue of prior disclosure.

Additive manufacturing (AM) represents a set of processes that enable layer by layer fabrication of complex 3D structures using a wide range of materials that include inorganic, hybrid organic-inorganic materials, polymers, and metals. The development of metal AM has revolutionized the production of complex parts for aerospace, automotive and medical applications. Today's resolution of most commercially available metal AM processes is ~20-50 μm$^2$; no established method is available for printing 3D features below these dimensions. It has been shown that unique phenomena arise in metals with micro- and nano-dimensions, for example light trapping in optical meta-materials and enhanced mechanical resilience. Accessing these phenomena requires developing a process to fabricate 3D metallic architectures with macroscopic overall dimensions and individual constituents in the sub-micron regime.

Minimum feature size in metal AM is generally limited by the material feed, which include metal powder, metal wire, sheet metal, and metal inks. Inkjet-based methods manipulate 40-60 μm droplets of metal inks; wire- and filament-based processes, i.e. Plasma Deposition and Electron Beam Freeform Fabrication (EBF3), rely on locally melting a >100 μm-diameter metal wire; and powder-based processes, i.e. Selective Laser Melting (SLM) and Laser Engineered Net Shaping (LENS), consolidate ~0.3-10 μm metal powder particles. Overcoming these resolution limitations requires developing the capability of a material feed to manipulate nanoscale quantities of metals in a stable and scalable 3D printing process. Alternative material feeds to fabricate 3D metal structures with a <10 μm resolution include nanoparticle inks, ion solutions, droplets of molten metal, and precursor gases. Methods that use localized electroplating or metal ion reduction are capable of producing features down to 500 nm using a very slow process that is limited by the electroplating rate. Electrochemical fabrication (EFAB) allows for manufacturing geometries with 10 μm features and 4 μm layers but is limited to structures with a total height of 25-50 layers. Other technologies, like micro-deposition of metal nanoparticle inks or molten metal and focused ion beam direct writing (FIBDW), also suffer from slow throughput and are more suited for low-volume fabrication and repair.

As used herein "framework material" refers to a metal, a metalloid, a metal alloy, a metal oxide, a metal nitride, an inorganic, and inorganic/organic hybrid and/or a carbon-based material that is present in a photoresist resin of the disclosure and that upon polymerization remains as part of a framework or structure. Moreover, in some instances, the framework-material remains as part of, or the only remaining component of, the framework or structure following heat treatment (e.g., pyrolization). In some embodiment, the framework-material comprises, but is not limited to, a metal ion that bridges 2 or more monomeric ligand units comprising photopolymerizable groups.

This disclosure provides a scalable and reproducible process to create complex 3D metal geometries with sub-micron (i.e., less than 1 μm, for example, 5-999 nm or any value there between) up to 50 μm (and any integer size there between) features by applying lithographic methods to metal-, inorganic-, and hybrid inorganic/organic-rich polymer resins.

The disclosure provides a photopolymerizable resist comprising a metal, a metalloid, a metal alloy, a metal oxide, a metal nitride, an inorganic, and inorganic/organic hybrid and/or a carbon-based material (the "framework-material"). The photopolymerizable resist comprises (i) a hybrid organic-inorganic polymer resin comprising a metal, a metalloid, a metal alloy, a metal oxide, a metal nitride, an inorganic, and inorganic/organic hybrid and/or a carbon-based material ("M") that are part of a monomeric ligand unit or that bridge at least two monomeric ligand units "L", e.g., L-M-L, (ii) a photoinitiator, and (iii) a reactable monomer.

The photopolymerizable organic-inorganic resin can be made by reacting a monodentate, bidentate or weak framework-material exchange ligand with at least one monomeric ligand unit. For example, the weak framework-material exchange ligand has the general structure: $(L^-)_n M^{n+}$, where $L^-$ is a negatively charged ligand, n is 1, 2, 3, 4, 5 or 6 and M is a metal, a metal, a metalloid, a metal alloy, a metal oxide, a metal nitride, an inorganic, and inorganic/organic hybrid and/or a carbon-based material cation.

The monomeric ligand unit generally comprises the structure:

wherein R is an alkene or a $C_{2-10}$ terminal alkene and R' is N, O, F, S or Cl. In one embodiment, the monomeric ligand unit is an acryloyl. In another embodiment, the monomeric ligand unit comprises a carboxylic acid and an alkene, e.g., C=R—COOH, wherein R is 1-10 carbons. A general scheme for producing a hybrid organic-inorganic polymer resin is provided in Scheme I:

Scheme I

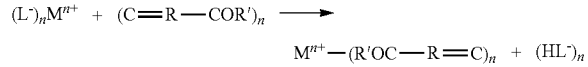

wherein "M" is a metal, a metal ion, a metalloid, a metal alloy, a metal oxide, a metal nitride, an inorganic, an inorganic/organic hybrid and/or a carbon-based material. In one embodiment, the metal or metal ion includes, but is not limited to, $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Sc^{3+}$, $Sc^{2+}$, $Sc^+$, $Y^{3+}$, $Y^{2+}$, $Y^+$, $Ti^{4+}$, $Ti^{3+}$, $Ti^{2+}$, $Zr^{4+}$, $Zr^{3+}$, $Zr^{2+}$, $Hf^{4+}$, $Hf^{3+}$, $V^{5+}$, $V^{4+}$, $V^{3+}$, $V^{2+}$, $Nb^{5+}$, $Nb^{4+}$, $Nb^{3+}$, $Nb^{2+}$, $Ta^{5+}$, $Ta^{4+}$, $Ta^{3+}$, $Ta^{2+}$, $Cr^{6+}$, $Cr^{5+}$, $Cr^{4+}$, $Cr^{3+}$, $Cr^{2+}$, $Cr^+$, Cr, $Mo^{6+}$, $Mo^{5+}$, $Mo^{4+}$, $Mo^{3+}$, $Mo^{2+}$, $Mo^+$, Mo, $W^{6+}$, $W^{5+}$, $W^{4+}$, $W^{3+}$, $W^{2+}$, $W^+$, W, $Mn^{7+}$, $Mn^{6+}$, $Mn^{5+}$, $Mn^{4+}$, $Mn^{3+}$, $Mn^{2+}$, $Mn^+$, $Re^{7+}$, $Re^{6+}$, $Re^{5+}$, $Re^{4+}$, $Re^{3+}$, $Re^{2+}$, $Re^+$, Re, $Fe^{6+}$, $Fe^{4+}$, $Fe^{3+}$, $Fe^{2+}$, $Fe^+$, Fe, $Ru^{8+}$, $Ru^{7+}$, $Ru^{6+}$, $Ru^{4+}$, $Ru^{3+}$, $Ru^{2+}$, $Os^{8+}$, $Os^{7+}$, $Os^{6+}$, $Os^{5+}$, $Os^{4+}$, $Os^{3+}$, $Os^{2+}$, $Os^+$, Os, $Co^{5+}$, $Co^{4+}$, $Co^{3+}$, $Co^{2+}$, $Co^+$, $Rh^{6+}$, $Rh^{5+}$, $Rh^{4+}$, $Rh^{3+}$, $Rh^{2+}$, $Rh^+$, $Ir^{6+}$, $Ir^{5+}$, $Ir^{4+}$, $Ir^{3+}$, $Ir^{2+}$, $Ir^+$, Ir, $Ni^{3+}$, $Ni^{2+}$, $Ni^+$, Ni, $Pd^{6+}$, $Pd^{4+}$, $Pd^{2+}$, $Pd^+$, Pd, $Pt^{6+}$, $Pt^{5+}$, $Pt^{4+}$, $Pt^{3+}$, $Pt^{2+}$, $Pt^+$, $Cu^{4+}$, $Cu^{3+}$, $Cu^{2+}$, $Cu^+$, $Ag^{3+}$, $Ag^{2+}$, $Ag^+$, $Au^{5+}$, $Au^{4+}$, $Au^{3+}$, $Au^{2+}$, $Au^+$, $Zn^{2+}$, $Zn^+$, Zn, $Cd^{2+}$, $Cd^+$, $Hg^{4+}$, $Hg^{2+}$, $Hg^+$, $B^{3+}$, $B^{2+}$, $B^+$, $Al^{3+}$, $Al^{2+}$, $Al^+$, $Ga^{3+}$, $Ga^{2+}$, $Ga^+$, $In^{3+}$, $In^{2+}$, $In^{1+}$, $Tl^{3+}$, $Tl^+$, $Si^{4+}$, $Si^{3+}$, $Si^{2+}$, $Si^+$, $Ge^{4+}$, $Ge^{3+}$, $Ge^{2+}$, $Ge^+$, Ge, $Sn^{4+}$, $Sn^{2+}$, $Pb^{4+}$, $Pb^{2+}$, $As^{5+}$, $As^{3+}$, $As^{2+}$, $As^+$, $Sb^{5+}$, $Sb^{3+}$, $Bi^{5+}$, $Bi^{3+}$, $Te^{6+}$, $Te^{5+}$, $Te^{4+}$, $Te^{2+}$, $La^{3+}$, $La^{2+}$, $Ce^{4+}$, $Ce^{3+}$, $Ce^{2+}$, $Pr^{4+}$, $Pr^{3+}$, $Pr^{2+}$, $Nd^{3+}$, $Nd^{2+}$, $Sm^{3+}$, $Sm^{2+}$, $Eu^{3+}$, $Eu^{2+}$, $Gd^{3+}$, $Gd^{2+}$, $Gd^+$, $Tb^{4+}$, $Tb^{3+}$, $Tb^{2+}$, $Tb^+$, $Db^{3+}$, $Db^{2+}$, $Ho^{3+}$, $Er^{3+}$, $Tm^{4+}$, $Tm^{3+}$, $Tm^{2+}$, $Yb^{3+}$, $Yb^{2+}$, $Lu^{3+}$ and alloys of any of the foregoing. In another embodiment, M is one or more metals or metal ions selected from the group comprising $Li^+$, $Mg^{2+}$, $Ca^{2+}$, $Ba^{2+}$, $Zr^{4+}$, $Zr^{3+}$, $Zr^{2+}$, $Mn^{3+}$, $Mn^{2+}$, $Mn^+$, $Fe^{3+}$, $Fe^{2+}$, $Fe^+$, $Ni^{3+}$, $Ni^{2+}$, $Ni^+$, Ni, $Cu^{4+}$, $Cu^{3+}$, $Cu^{2+}$, $Cu^+$, $V^{5+}$, $V^{4+}$, $V^{3+}$, $V^{2+}$, $Co^{3+}$, $Co^{2+}$, $Co^+$, $Zn^{2+}$, $Zn^+$, $Ce^{4+}$, $Ce^{3+}$, and $Ce^{2+}$ or alloys of any of the foregoing. In yet another embodiment, M is one or more metal ions selected from the group comprising $Li^+$, $Mg^{2+}$, $Ca^{2+}$, $Ba^{2+}$, $Zr^{2+}$, $Mn^2$, $Fe^{2+}$, $Ni^{2+}$, $Cu^{2+}$, $V^{2+}$, $Co^{2+}$, $Zn^{2+}$, and $Ce^{2+}$. In a further embodiment, M is $Ni^{2+}$ or $Co^{2+}$ metal ions. The inorganic can be a single or mixed oxide, carbide, nitride, silicate, boride of Ti, W, Si, Zr, Al, Y, Cr, Fe, Pb, Co, or a rare earth element. For example, the inorganic can include, but is not limited to, $TiO_2$, $AlO_2$, $AlO_3$, $ZrO_2$, SiC, $SiO_2$, SiC, $CeO_2$, or ZnO. A suitable metal-inorganic composite includes, but is not limited to, metal-inorganic composite coating comprises Au—Ni—$TiO_2$, Ni—Co—$TiO_2$, Ni—Zn—$Al_2O_3$, or Ni—B—$TiO_2$.

Suitable monodentate, bidentate or weak exchange ligands ("$L^-$") include, e.g., various alkoxides. Examples of weak framework-material exchange ligand (e.g., $(L^-)_n M$) are selected from the group consisting of aluminum triethoxide, aluminum isopropoxide, aluminum sec-butoxide, aluminum tri-t-butoxide, magnesium trifluoroacetylacetonate, magnesium methoxide, magnesium ethoxide, titanium methoxide, titanium ethoxide, titanium isopropoxide, titanium propoxide, titanium butoxide, titanium ethylhexoxide, titanium (triethanolaminato) isopropoxide, titanium bis (ethyl acetoacetato) diisopropoxide, titanium bis (2,4-pentanedionate)diisopropoxide, zirconium ethoxide, zirconium isopropoxide, zirconium propoxide, zirconium sec-butoxide, zirconium t-butoxide, aluminum, di-s-butoxide ethylacetonate, calcium methoxyethoxide, calcium methoxide, magnesium methoxyethoxide, copper ethoxide, copper methoxyethoxyethoxide, antimony butoxide, bismuth pentoxide, chromium isopropoxide, tin ethoxide, zinc methoxyethoxide, titanium n-nonyloxide, vanadium tri-n-propoxide oxide, vanadium triisobutoxide oxide, iron ethoxide, tungsten ethoxide, samarium isopropoxide, lanthanium methoxyethoxide, cerium(IV)2-methoxethoxide, lanthanium (III) 2-methoxethoxide, Yttrium 2-methoxethoxide, and calcium 2-methoxethoxide.

In one embodiment, the reaction of scheme I provides an hybrid organic-inorganic polymer resin that comprises a metal diacrylate, metal triacrylate or 2 or more acrylate monomers bridged or coordinated by a metal, a metalloid, a metal alloy, a metal oxide, a metal nitride, an inorganic, and inorganic/organic hybrid and/or a carbon-based material. For example, the hybrid organic-inorganic polymer resin can have the general structure $(C=R_m H_{2m+1}COR')_n M^{n+}$ wherein m is any integer between, and including, 1 and 10, n is an integer between 1 and 6, wherein R is a $C_{1-10}$ alkane and R' is N, O, F, S or Cl. In one embodiment, the a hybrid organic-inorganic polymer resin has the formula C=R—COR'-$M^{2+}$—R'OC—R=C, wherein M is a divalent metal ion. In one embodiment, the divalent ion is a divalent metal ion selected from the group consisting of $Be^{2+}$, $Mg^{2+}$, $Ca^{2+}$, $Sr^{2+}$, $Ba^{2+}$, $Sc^{2+}$, $Y^{2+}$, $Ti^{2+}$, $Zr^{2+}$, $V^{2+}$, $Nb^{2+}$, $Ta^{2+}$, $Cr^{2+}$, $Mo^{2+}$, $W^{2+}$, $Mn^{2+}$, $Re^{2+}$, $Fe^{2+}$, $Ru^{2+}$, $Os^{2+}$, $Co^{2+}$, $Rh^{2+}$, $Ir^{2+}$, $Ni^{2+}$, $Pd^{2+}$, $Pt^{2+}$, $Cu^{2+}$, $Ag^{2+}$, $Au^{2+}$, $Zn^{2+}$, $Cd^{2+}$, $B^{2+}$, $Al^{2+}$, $Ga^{2+}$, $Sn^{2+}$, $Pb^{2+}$, $Hg^{2+}$, $As^{2+}$, $Te^{2+}$, $La^{2+}$, $Ce^{2+}$, $Pr^{2+}$, $Sm^{2+}$, $Gd^{2+}$, $Nd^{2+}$, $Db^{2+}$, $Tb^{2+}$, $Tm^{2+}$ and $Yb^{2+}$.

FIG. 1A depicts an exemplary reaction between (i) a weak framework-material ligand (e.g., methoxyethoxide) bound to nickel and (ii) acrylic acid as the monomeric ligand unit to yield the hybrid organic-inorganic polymer resin, nickel acrylate.

The disclosure further provides a method of making a photopolymerizable framework-material photoresist. The method comprises mixing (i) a hybrid organic-inorganic polymer resin (e.g., "metal precursor" nickel acrylate; see FIG. 1A) with (ii) a monomer comprising a photochemical polymerizable group that allows for propagating carbon or nitrogen chains and (iii) a photoinitiator.

The photoinitiator used in the photopolymerizable resist mixture causes a radical reaction or ion reaction in response to contact by light. There are a number of photoinitiators known in the art. For example, suitable photoinitiators include, but are not limited to, 7-diethylamino-2-coumarin, acetophenone, p-tert-butyltrichloro acetophenone, chloro acetophenone, 2-2-diethoxy acetophenone, hydroxy acetophenone, 2,2-dimethoxy-2'-phenyl acetophenone, 2-amino acetophenone, dialkylamino acetophenone, benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropane-1-one, 1-(4-isopropylphenyl)-2-hydroxy-2-methylpropane-1-one, benzyl dimethyl ketal, benzophenone, benzoylbenzoic acid, methyl benzoyl benzoate, methyl-o-benzoyl benzoate, 4-phenyl benzophenone, hydroxy benzophenone, hydroxypropyl benzophenone, acrylic benzophenone, 4-4'-bis(dimethylamino)benzophenone, perfluoro benzophenone, thioxanthone, 2-chloro thioxanthone, 2-methyl thioxanthone, diethyl thioxanthone, dimethyl thioxanthone, 2-methyl anthraquinone, 2-ethyl anthraquinone, 2-tert-butyl anthraquinone, 1-chloro anthraquinone, 2-amyl anthraquinone, acetophenone dimethyl ketal, benzyl dimethyl ketal, α-acyl oxime ester, benzyl-(o-ethoxycarbonyl)-α-monoxime, acyl phosphine oxide, glyoxy ester, 3-keto coumarin, 2-ethyl anthraquinone, camphor quinone, tetramethylthiuram sulfide, azo bis isobutyl nitrile, benzoyl peroxide, dialkyl peroxide, tert-butyl peroxy pivalate, perfluoro tert-butyl peroxide, perfluoro benzoyl peroxide, etc. Further, it is possible to use these photoinitiator alone or in combination of two or more. Other photoinitiators will be known in the art.

The monomer of the monomeric ligand unit can be any momomeric compound having an activatable photopolymerizable group that can propagate carbon or nitrogen bond formation. In one embodiment, the monomer is polymerized to form a polyacrylate such as polymethylmethacrylate, an unsaturated polyester, a saturated polyester, a polyolefin (polyethylenes, polypropylenes, polybutylenes, and the like), an alkyd resin, an epoxy polymer, a polyamide, a polyimide, a polyetherimide, a polyamideimide, a polyesterimide, a polyesteramideimide, polyurethanes, polycarbonates, polystyrenes, polyphenols, polyvinylesters, polysilicones, polyacetals, cellulose acetates, polyvinylchlorides, polyvinylacetates, polyvinyl alcohols polysulfones, polyphenylsulfones, polyethersulfones, polyketones, polyetherketones, poyletheretherketones, polybenzimidazoles, polybemzoxazoles, polybenzthiazoles, polyfluorocarbones, polyphenylene ethers, polyarylates, cyanate ester polymers, copolymers of two or more thereof, and the like.

Examples of acrylic monomers include monoacrylics, diacrylics, triacrylics, tetraacrylics, pentacrylics, etc. Examples of polyacrylates include polyisobornylacrylate, polyisobornylmethacrylate, polyethoxyethoxyethyl acrylate, poly-2-carboxyethylacrylate, polyethylhexylacrylate, poly-2-hydroxyethylacrylate, poly-2-phenoxyethylacrylate, poly-2-phenoxyethylmethacrylate, poly-2-ethylbutylmethacrylate, poly-9-anthracenylmethylmethacrylate, poly-4-chlorophenylacrylate, polycyclohexylacrylate, polydicyclopentenyloxyethyl acrylate, poly-2-(N,N-diethylamino)ethyl methacrylate, poly-dimethylaminoeopentyl acrylate, polycaprolactone 2-(methacryloxy)ethylester, and polyfurfurylmethacrylate, poly(ethylene glycol)methacrylate, polyacrylic acid and poly(propylene glycol) methacrylate.

Examples of suitable diacrylates which can be used to form polyacrylates include 2,2-bis(4-methacryloxyphenyl) propane, 1,2-butanediol diacrylate, 1,4-butanediol diacrylate, 1,4-butanediol dimethacrylate, 1,4-cyclohexanediol dimethacrylate, 1,10-decanediol dimethacrylate, diethylene glycol diacrylate, dipropylene glycol diacrylate, dimethylpropanediol dimethacrylate, triethylene glycol dimethacrylate, tetraethylene glycol dimethacrylate, 1,6-hexanediol diacrylate, neopentyl glycol diacrylate, polyethylene glycol dimethacrylate, tripropylene glycol diacrylate, 2,2-bis[4-(2-acryloxyetho-xy)phenyl]propane, 2,2-bis[4-(2-hydroxy-3-methacryloxypropoxy)phenyl]propane, bis(2-methacryloxyethyl)N,N-1,9-nonylene biscarbamate, 1,4-cycloheanedimethanol dimethacrylate, and diacrylic urethane oligomers (reaction products of isocyanate terminate polyol and 2-hydroethylacrylate). Examples of triacrylates which can be used to form polyacrylates include tris(2-hydroxyethyl)isocyanurate trimethacrylate, tris(2-hydroxyethyl)isocyanurate triacrylate, trimethylolpropane trimethacrylate, trimethylolpropane triacrylate and pentaerythritol triacrylate. Examples of tetracrylates include pentaerythritol tetraacrylate, di-trimethylopropane tetraacrylate, and ethoxylated pentaerythritol tetraacrylate. Examples of pentaacrylates include dipentaerythritol pentaacrylate and pentaacrylate ester.

As mentioned above the hybrid organic-inorganic polymer resin is not limited. The hybrid organic-inorganic polymer resin used in the photopolymerizable resist is not limited so long as the hybrid organic-inorganic polymer resin comprises a polymerizable monomer. Such polymerizable groups on the hybrid organic-inorganic polymer resin typically have acryloyl group or a methacryloyl group, monomers having a vinyl group, and monomers having an allyl group. Further, the hybrid organic-inorganic polymer resin will typically be polyfunctional monomers comprising a plurality of polymerizable groups, and the number of polymerizable groups comprises an integer of from 1 to 4. Examples an acryloyl group or a methacryloyl group useful in a hybrid organic-inorganic polymer resin are (meth) acrylic acids; aromatic (meth)acrylates such as phenoxyethyl acrylate, benzyl acrylate, etc.; hydrocarbon (meth) acrylates such as stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, etc.; ethereal oxygen atom-containing hydrocarbon (meth)acrylates such as ethoxyethyl acrylate, methoxyethyl acrylate, glycidyl acrylate, tetrahydrofurfuryl acrylate, diethylene glycol diacrylate, neopentylglycol diacrylate, polyoxyethylene glycol diacrylate, tripropylene glycol diacrylate, etc.

After the photopolymerizable framework-material photoresist has been prepared, it can be stored under appropriate conditions (depending upon the components, e.g., under inert gas and typically in the dark). The photopolymerizable framework-material photoresist can be applied to a substrate by spin, drop cast, dip coating or any other commonly used methods. In some embodiments, the method can utilize a technique to carefully control the amount, thickness or layering of the photopolymerizable framework-material photoresist. The photopolymerizable framework-material photoresist can be drop cast or deposited on a substrate at any appropriate thickness evenly or unevenly. The substrate is not limiting and can be any of a glass, a polymer, a ceramic, an inorganic, an alumina, a stainless steel, a titanium and a semiconductive substrate.

The photopolymerizable framework-material photoresist is then exposed to one or more beams of photons/light to initiate free radical production by the photoinitiator and to polymerize the monomers to produce a polymeric material containing a framework-material. In one embodiment, the method uses a two photon lithography (TPL) technique. Two photon lithography allows for the penetration of the photopolymerizable framework-material photoresist by the individual photon beams which are individually insufficient to cause polymerization until both contact a photopolymerizable location. Under TPL, each of the photon beams provides one-half the energy required to cause photoinitiation and thus polymerization. Thus, a 3D structures can be fabricated using a polymerizable system that requires two photons to simultaneously impinge on a photopolymerizable material. The two photons can be dimensionally targeted (e.g., by mirrors) or may be temporally targeted (e.g., pulsed lasers). Local activation of the photopolymerizable framework-material photoresist occurs by simultaneous absorption of the two photons. Typically, the wavelengths are in the near-infrared region.

After polymerization of a desires structure comprising a framework-material, non-polymerized monomers and reagents are washed away. The remaining structure can then be dried or pyrolyzed to remove any remaining organic material. The resulting structure comprises an almost entirely metal-, inorganic-, carbon-, oxide-, nitride and/or carbon-based structure.

In any of the foregoing paragraphs, the term "framework-material" can be replaced with the term "metal" and/or "metal ion". For example, the term "framework-material" can be replaced with any of $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Sc^{3+}$, $Sc^{2+}$, $Sc^+$, $Y^{3+}$, $Y^{2+}$, $Y^+$, $Ti^{4+}$, $Ti^{3+}$, $Ti^{2+}$, $Zr^{4+}$, $Zr^{3+}$, $Zr^{2+}$, $Hf^{4+}$, $Hf^{3+}$, $V^{5+}$, $V^{4+}$, $V^{3+}$, $V^{2+}$, $Nb^{5+}$, $Nb^{4+}$, $Nb^{3+}$, $Nb^{2+}$, $Ta^{5+}$, $Ta^{4+}$, $Ta^{3+}$, $Ta^{2+}$, $Cr^{6+}$, $Cr^{5+}$, $Cr^{4+}$, $Cr^{3+}$, $Cr^{2+}$, $Cr^+$, $Cr$, $Mo^{6+}$, $Mo^{5+}$, $Mo^{4+}$, $Mo^{3+}$, $Mo^{2+}$, $Mo^+$, $Mo$, $W^{6+}$, $W^{5+}$, $W^{4+}$, $W^{3+}$, $W^{2+}$, $W^+$, $W$, $Mn^{7+}$, $Mn^{6+}$, $Mn^{5+}$, $Mn^{4+}$, $Mn^{3+}$, $Mn^{2+}$, $Mn^+$, $Re^{7+}$, $Re^{6+}$, $Re^{5+}$, $Re^{4+}$, $Re^{3+}$, $Re^{2+}$, $Re^+$, $Re$, $Fe^{6+}$, $Fe^{4+}$, $Fe^{3+}$, $Fe^{2+}$, $Fe^+$, $Fe$, $Ru^{8+}$, $Ru^{7+}$, $Ru^{6+}$, $Ru^{4+}$, $Ru^{3+}$, $Ru^{2+}$, $Os^{8+}$, $Os^{7+}$, $Os^{6+}$, $Os^{5+}$, $Os^{4+}$, $Os^{3+}$, $Os^{2+}$, $Os^+$, $Os$, $Co^{5+}$, $Co^{4+}$, $Co^{3+}$, $Co^{2+}$, $Co^+$, $Rh^{6+}$, $Rh^{5+}$, $Rh^{4+}$, $Rh^{3+}$, $Rh^{2+}$, $Rh^+$, $Ir^{6+}$, $Ir^{5+}$, $Ir^{4+}$, $Ir^{3+}$, $Ir^{2+}$, $Ir^+$, $Ir$, $Ni^{3+}$, $Ni^{2+}$, $Ni^+$, $Ni$, $Pd^{6+}$, $Pd^{4+}$, $Pd^{2+}$, $Pd^+$, $Pd$, $Pt^{6+}$, $Pt^{5+}$, $Pt^{4+}$, $Pt^{3+}$, $Pt^{2+}$, $Pt^+$, $Cu^{4+}$, $Cu^{3+}$, $Cu^{2+}$, $Cu^+$, $Ag^{3+}$, $Ag^{2+}$, $Ag^+$, $Au^{5+}$, $Au^{4+}$, $Au^{3+}$, $Au^{2+}$, $Au^+$, $Zn^{2+}$, $Zn^+$, $Zn$, $Cd^{2+}$, $Cd^+$, $Hg^{4+}$, $Hg^{2+}$, $Hg^+$, $B^{3+}$, $B^{2+}$, $B^+$, $Al^{3+}$, $Al^{2+}$, $Al^+$, $Ga^{3+}$, $Ga^{2+}$, $Ga^+$, $In^{3+}$, $In^{2+}$, $In^{1+}$, $Tl^{3+}$, $Tl^+$, $Si^{4+}$, $Si^{3+}$, $Si^{2+}$, $Si^+$, $Ge^{4+}$, $Ge^{3+}$, $Ge^{2+}$, $Ge^+$, $Ge$, $Sn^{4+}$, $Sn^{2+}$, $Pb^{4+}$, $Pb^{2+}$, $As^{5+}$, $As^{3+}$, $As^{2+}$, $As^+$, $Sb^{5+}$, $Sb^{3+}$, $Bi^{5+}$, $Bi^{3+}$, $Te^{6+}$, $Te^{5+}$, $Te^{4+}$, $Te^{2+}$, $La^{3+}$, $La^{2+}$, $Ce^{4+}$, $Ce^{3+}$, $Ce^{2+}$, $Pr^{4+}$, $Pr^{3+}$, $Pr^{2+}$, $Nd^{3+}$, $Nd^{2+}$, $Sm^{3+}$, $Sm^{2+}$, $Eu^{3+}$, $Eu^{2+}$, $Gd^{3+}$, $Gd^{2+}$, $Gd^+$, $Tb^{4+}$, $Tb^{3+}$, $Tb^{2+}$, $Tb^+$, $Db^{3+}$, $Db^{2+}$, $Ho^{3+}$, $Er^{3+}$, $Tm^{4+}$, $Tm^{3+}$, $Tm^{2+}$, $Yb^{3+}$, $Yb^{2+}$ and $Lu^{3+}$. In one embodiment, the framework material is a divalent metal ion.

Figure 1B:
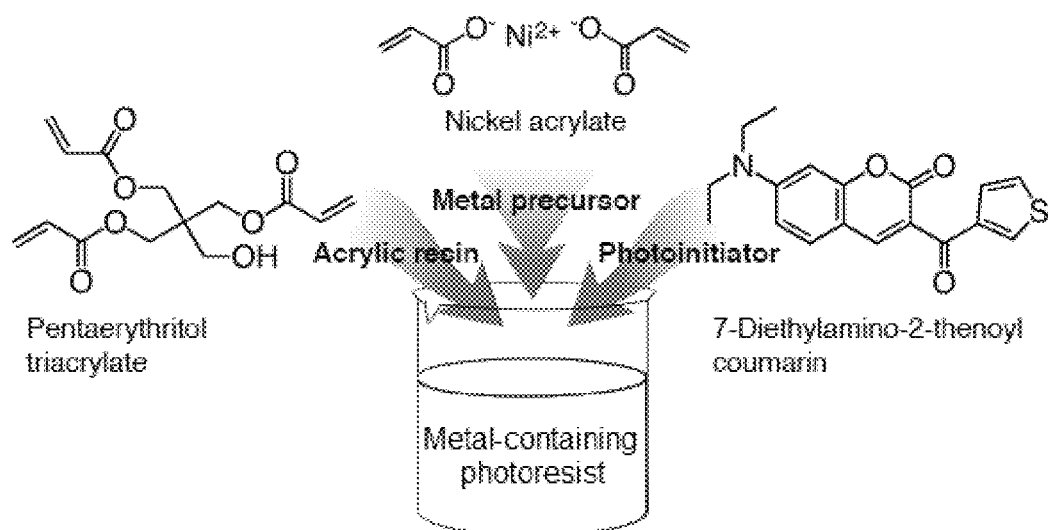
Figure 1C:
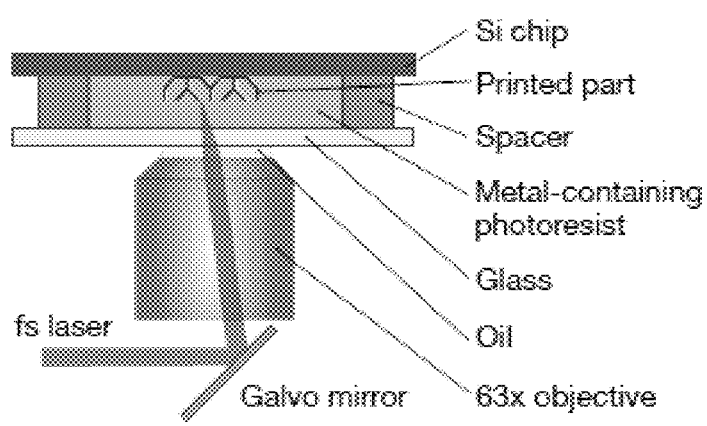

Although any number of materials can be used in the methods and compositions (as described above), the disclosure exemplifies the methods of the disclosure using, in one embodiment, nickel acrylate made by a ligand exchange reaction between nickel alkoxide and acrylic acid (FIG. 1A) and then combining it with another acrylic monomer, pentaerythritol triacrylate, and a photoinitiator (PI), 7-diethyl-amino-3-thenoylcoumarin, (FIG. 1B). The photoresist is then applied (e.g., by drop casting) to a substrate (e.g., a silicon substrate) and two-photon lithography (TPL) is used to sculpt a desired 3D architecture (FIG. 1C). The non-polymerized resist was then washed away, and the free-standing cross-linked polymer nano- and/or micro-architectures were then heat processed. The heat processing can be used to further catalyze the conversion of a framework-material (e.g., carbon to graphene) or to remove volatile material. For example, the nano- and/or micro-architectured structure is pyrolyzed to volatilize the organic content. This process yielded a ~80% smaller replica of the original 3D structure made entirely out of metal (FIG. 1D).

Pyrolysis can be performed in a one- or multi-step process. For example, in one embodiment, a two-step process is used that includes performing pyrolysis in a furnace at about 600-1000° C. to remove organic content and to consolidate metal and/or inorganic features followed by a lower temperature heat processing of about 200-600° C. to reduce the oxygen content.

Figure 6:
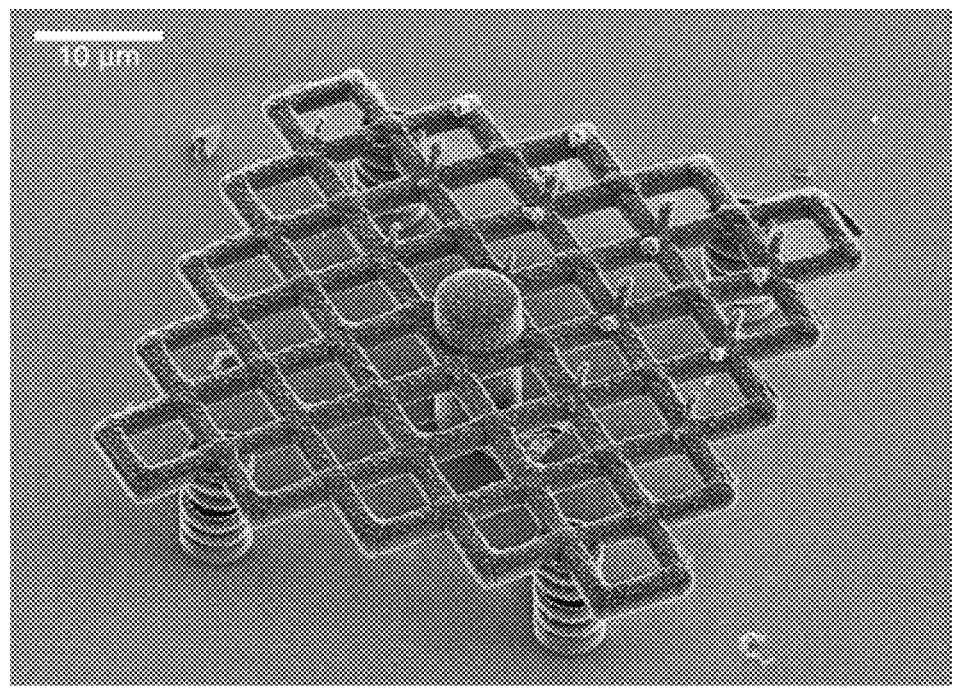
FIG. 6 shows an SEM image of a representative supporting structure used to decouple the part from the substrate during pyrolysis.

The disclosure provides a feasible and efficient method of fabricating a metal, a metalloid, a metal alloy, a metal oxide, a metal nitride, an inorganic, a hybrid inorganic-organic and/or a carbon-based material nano- and/or micro-structures. For example, the methods of the disclosure produced nanolattices with 10 μm octet unit cells comprised of 2 μm-diameter circular beams out of the synthesized photopolymerizable framework-material photoresist using layer-by-layer TPL with 150 nm layer thickness. SEM images in FIG. 1F-H reveal that these nanolattices had fully dense beams and uniformly sized, high-fidelity features. These nanolattices had four unit cells on each side, 40 μm, and a height of three unit cells, 30 μm, and were supported by vertical springs at each corner and by a vertical pillar the center. These supports served as pedestals that would allow the sample to release from substrate after undergoing an isotropic ~80% shrinkage during pyrolysis (see FIG. 6).

The disclosure thus, provides an additive manufacturing (AM) process to create 3D nano- and micro-architected metal, metalloid, metal alloy, metal oxide, metal nitride, inorganic, inorganic-organic hybrid and/or carbon-based materials using a scalable lithography-based approach. As exemplified below, the process produced Ni octet-lattices with 2 μm unit cells, 300-400 nm beams and 30 nm layers. The resolution of the method of the disclosure allows printing metal features with 25-100 nm dimensions, which is an order of magnitude smaller than feature sizes produced using all other 3D-capable metal AM methods. Lateral feature sizes of complex 3D architectures fabricated using this process can be further refined to 24 nm. This nanoscale metal AM method is not limited to nickel as exemplified below, but can be applied to other organometallics as described elsewhere herein and can be used to derive UV-curable metal-based photoresists using similar chemical synthesis. Successful fabrication of nickel 3D nano-structures demonstrates that this approach can be applied to print sophisticated metallic architectures that are challenging to 3D print using established metal AM processes, e.g. molybdenum and tungsten. Nanoscale additive manufacturing of metals has direct implications and open opportunities for scalable production of complex sub-millimeter devices, including 3D MEMS, 3D microbattery electrodes, and microrobots and tools for minimally invasive medical procedures.

For example, the methods of the disclosure allow for the generation of metal, metalloid, metal alloy, metal oxide, metal nitride, inorganic, inorganic-organic hybrid and/or carbon-based nanostructures that provide high surface areas. This is important in various applications that utilize various metal and/or inorganic properties.

Solar disinfection of drinking water (SODIS) is an approach for water purification widely used in households with limited access to fresh water. SODIS relies on microorganism inactivation triggered by sunlight energy in the UV spectrum and requires processing times of up to 48 hr. Water treatment rate is drastically increased by using photocatalytic materials, such as $TiO_2$, which can harvest sunlight to promote generation of reactive oxygen species (ROS) that inactivate bacteria within few hours. One main challenge that impedes the insertion of photocatalysts in most water treatment approaches is the need to populate the catalyst particles on a three-dimensional (3D) structure with a high-surface area that is stable under water flow.

The disclosure demonstrates that the method of the disclosure can be utilized to fabricate an architectured $TiO_2$ device that does not require expensive filtering of the catalyst. The $TiO_2$ device was fabricated using the additive manufacturing (AM) method of the disclosure and using titania as the framework-material. As described above, a weak ligand was used to create a titanium monomers via a ligand exchange reaction between titanium alkoxide and acrylic acid and utilize the titanium monomers to prepare a photopolymerizable titania photoresist. This photoresist was then used in a commercial stereolithography apparatus to define complex 3D architectures, which was then pyrolyzed to remove organic content. The resulting structure has ~40% reduced dimensions compared with its as-fabricated counterpart and has a chemical composition of 46 wt % Ti, 31 wt % O, and 23 wt % C, as measured at the surface by Energy-Dispersive Spectroscopy (EDS). Using this methodology, 3D structures were fabricated with periodic cubic and octet geometries whose unit cells range from 0.65 to 1.14 mm, beam lengths of 115-170 µm, and relative densities of 11-31%. Transmission Electron Microscopy (TEM) analysis reveals the microstructure of these lattices is nanocrystalline titania (rutile) with a mean grain size of ~60 nm. Mechanical experiments reveal that these cubic titania microlattices, whose density is 350-365 kg/m$^3$, achieve compressive strengths of up to 4.3 MPa, which is several times stronger than what is reported for titania foams with comparable density.

Figures 7A, 7B:
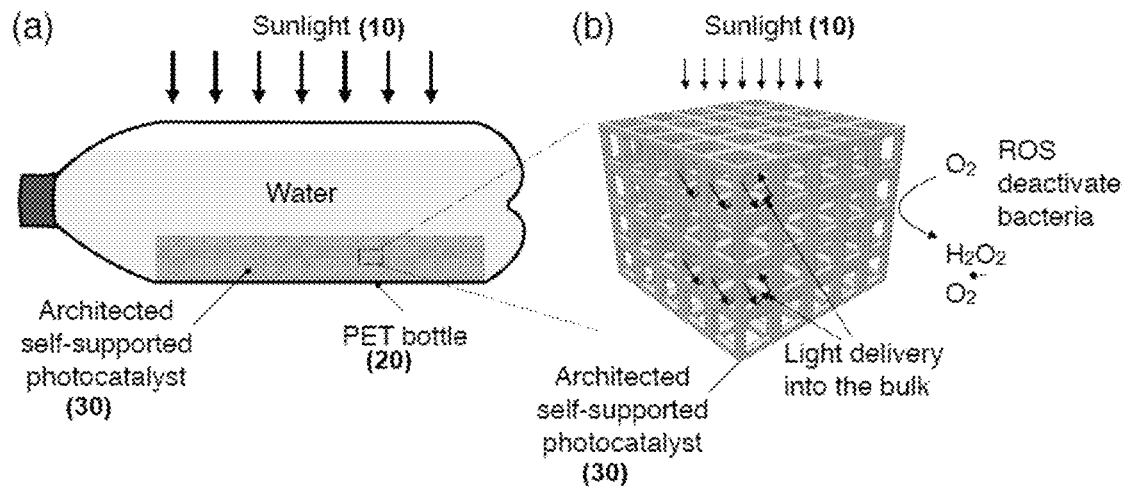
FIG. 7A-C shows a concept of a household solar water disinfection device. (A) Architected self-supported titania is placed inside a PET bottle filled with water in the sunlight. (B) The photocatalyst promotes generation of ROS that deactivates microorganisms. The architecture allows for the light to be delivered into the bulk of the photocatalyst, supporting the disinfection throughout the whole volume of the reactor. (C) After disinfection is complete, the water can be consumed right away, without the need to filter out the catalyst.
Figure 7C:
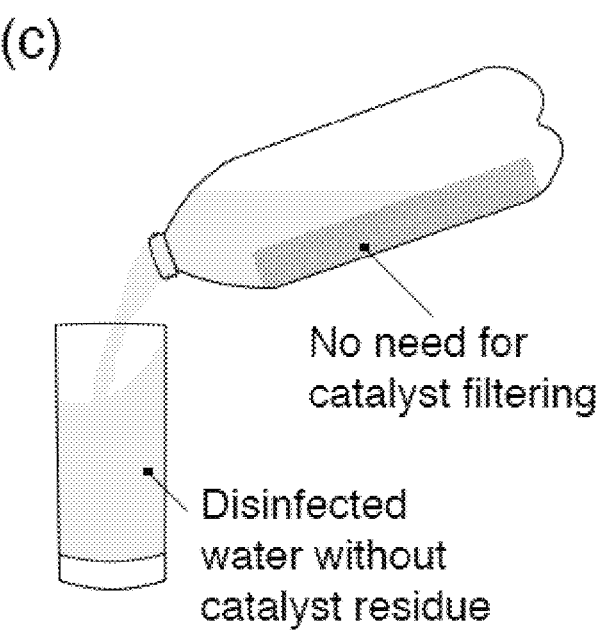

As an exemplary embodiment, the disclosure provides a water disinfection device made by the methods of the disclosure. A rendition of an architected titania device for household solar water disinfection is shown in FIG. 7. A three-dimensional titania scaffold (30) (as described above) is placed inside of an optically transparent (e.g., PET) filled water bottle (20) and placed in the sunlight (10) (FIG. 7A). The light interacts with the titania photocatalyst in the titania scaffold (30), which promotes the reaction with water and dissolved oxygen to produce hydroxyl (.OH) and superoxide radicals (.O2-) that deactivate bacteria (FIG. 7B). The designed open-cell architecture of the scaffold allows the light to propagate throughout the photocatalyst volume, which promotes the generation of ROS throughout the entire liquid volume and efficiently disinfects the water. High strength of the architected structure ensures that the catalytic material is not released to the treated water, so that it can be readily consumed after the disinfection (FIG. 7C).

The foregoing embodiment further demonstrates that various metals, metalloids and/or inorganics can be used in the methods and compositions of the disclosure. Moreover, that the titania AM process can be used to create safe, efficient and cost-effective photocatalytic reactors for household water disinfection, as well as for applications in photocatalytic hydrogen production, $CO_2$ conversion, and tissue engineering.

Outstanding electrical and optical properties of graphene, sp2-hybridized planar allotrope of carbon, have made it highly attractive for transparent conductive films (TCFs) and energy storage/conversion device applications. Transferring the desired properties of graphene onto non-planar devices requires methods for defining the net shape of graphene architectures, such as 3D printing. The existing methods for AM of graphene-containing materials imply either low graphene/graphene oxide (G/GO) loading of resins for stereolithography or using low-resolution extrusion-based techniques for material deposition. These considerations limit graphene AM either to structures with low graphene content or to at most 100 µm resolution.

Using the methods described herein an AM process for graphene foams is provided. For example, an AM of graphene foams with critical dimensions in the nano-scale regime. This embodiment, includes (i) defining a 3D structure using a hybrid organic-inorganic chemical that contains inorganic nickel clusters branched with functional groups that allow for photopolymerization and (ii) pyrolyzing the structure to achieve catalytic conversion of carbon to graphene. As described herein above and in Example 1, below, nickel-containing acrylic resin can be mixed with a photoinitiator to form a catalyst-containing photoresist. 3D structure made of catalyst-containing polymer can then be defined using lithographic methods. The structure can be further pyrolyzed leading to nickel-catalyzed conversion solid-source carbon to sp2-hybridized form, effectively defining a G/GO 3D structure.

The method includes (i) preparing a nickel photoresist (as described herein), (ii) defining a 3D structure with micron- or submicron-sized features made of the Ni photoresist using two-photon lithography, and (iii) pyrolyzing the resulting structure in forming gas to yield a 3D printed nickel/G/GO structure with 400 nm features.

AM of G/GO aerogel structures is accomplished using alternative 3D-printing methods, e.g. micro-SL, SL, etc. Furthermore, carbon nanotube (CNT) structures may be fabricated via catalytic conversion of solid source carbon in the 3D polymer structure using incorporated iron or nickel NPs. Additionally, graphene foams may be architected to decouple electrical and optical properties for TCEs. Graphene structures can be fabricated to have a smaller footprint, yielding a more transparent film. At the same time, more interconnects can be added to the architected graphene film structure, which may decrease the sheet resistance of the film.

In another aspect, a metal alkoxide-derived acrylic resin can be used for patterning of catalytic particles to enable nano-scale spatial control of chemical processes. In this embodiment, a 2D pattern of metal catalyst-containing resin can be defined on a substrate using lithography. Then the organic content of the structure can be removed (e.g., using thermal processing), which leaves a pattern of metal nanoparticles (NPs). Metal NP size distribution can be controlled via metal content of the resin and geometrical parameters of the pattern (e.g. line width and line thickness). These NPs can be further used to locally catalyze a chemical process, such as catalytic synthesis of nanomaterials.

EXAMPLES

Example 1

UV-curable metal-based photoresist. Acrylic acid (anhydrous, 99%), propylene glycol monomethyl ether acetate (PGMEA) (>99.5%), dichloromethane (anhydrous, ≥99.8%), 2-methoxyethanol (anhydrous, 99.8%), and isopropyl alcohol (IPA) (99.7%) were purchased from Sigma Aldrich. Nickel 2-methoxyethoxide, 5% w/v in 2-methoxyethanol was purchased from Alfa Aesar, and 7-diethylamino-3-thenoylcoumarin was purchased from Exciton. Acrylic acid (100 mg) was slowly added to nickel 2-methoxyethoxide solution (1290 mg) in a glove box and manually agitated. Nearly immediately a change of the solution color from brown to green was observed, which is indicative of a ligand exchange reaction. The mixture was held at low pressure in the antechamber of the glove box for 45 min to remove ~60% of 2-methoxyethanol. The resulting precursor was then taken out of the glove box, mixed with 300 mg of pentaerythritol triacrylate, and agitated using a vortex mixer for 1 min. 7-diethylamino-3-thenoylcoumarin (23 mg) was dissolved in 100 mg of dichloromethane, added to the mixture, which was then agitated using a vortex mixer for 1 min.

Two-photon lithography. Metal-containing polymer structures were fabricated on a silicon chip (1×1 cm) using a commercially available two-photon lithography system (Photonic Professional GT, Nanoscribe GmbH). Metal-containing photoresist was drop cast on a glass slide (0.17 mm thick, 30 mm in diameter) and confined between the glass slide and a silicon chip using 100 μm thick, 2×10 mm ribbons of Kapton tape as spacers. Laser power and scan speeds were set at 17.5-22.5 mW and 4-6 mm s$^{-1}$, respectively. After the printing process, the samples were developed in 2-methoxyethanol for 1 hour, followed by immersion in PGMEA for 10 min and filtered IPA for 5 min. The samples were then processed in a critical point dryer (Autosamdri-931).

Pyrolysis. Pyrolysis of the cross-linked metal-containing structures was conducted in two steps in a quartz tube furnace using 4" quartz tube. As the first step, a heating profile of 2° C./min to 1000° C., hold at 1000° C. for 1 hour was applied under 1 L/min argon flow, and the part was let to cool down in the furnace to room temperature. During the second step the part was heated at 2° C./min to 600° C. under 1 L/min forming gas flow (5% $H_2$, 95% $N_2$), held at 600° C. for 1 hour, and let to cool down to room temperature. No additional processing was performed after pyrolysis.

Material characterization. Scanning Electron Microscopy (SEM) images were obtained using an FEI Versa 3D Dual-Beam. SEM Energy-Dispersive X-Ray Spectroscopy (EDS) characterization was performed using a Zeiss 1550VP FESEM equipped with an Oxford X-Max SDD system using 10 kV electron beam.

Transmission Electron Microscopy (TEM) and TEM EDS were performed using FEI Tecnai F30ST (300 kV) transmission electron microscope equipped with Oxford ultrathin window EDS detector. TEM sample was prepared by fabricating metal structures directly on PELCO Holey Silicon Nitride Support Film for TEM with 1250 nm holes (Ted Pella) following the process described above.

Figure 3A:
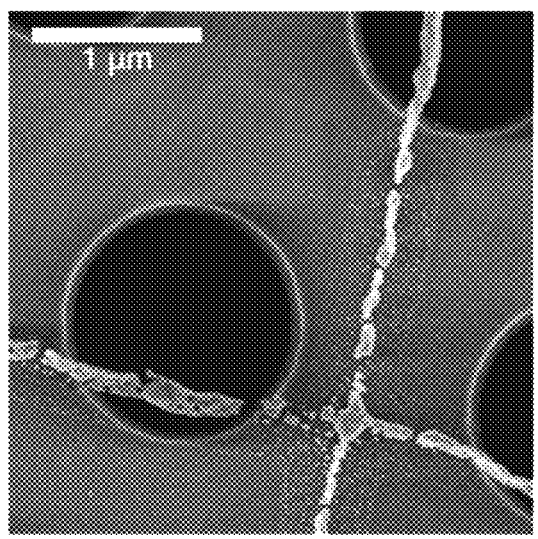
FIG. 3A-F shows TEM characterization of the resulting metal structure. (A) SEM image of nickel beams fabricated directly on a 200 nm-thick SiN membrane TEM grid (B) Low-magnification TEM of a 100 nm nickel beam overhanging the edge of 1.25 μm hole in a SiN membrane. (C) TEM image of the metal sample region where the diffraction pattern was taken. (D) Electron diffraction pattern shows that the printed beam consists mostly out of polycrystalline nickel with a small amount of nickel oxide. (E) HRTEM image of a printed metal beam. Analysis of atomic plane distances using FFT shows predominantly polycrystalline nickel (region 1) with some amount of nickel carbide within the structure (region 2) and nickel oxide at the surface of the structure (region 3). (F) Grain size histogram for n=40 particles measured from a TEM image.

Phases and Miller indices for the phases in HRTEM image (FIG. 3E) were assigned based on the two lattice distances $d_{hkl}$ and the angle measured from FFT patterns. First, lattice distances $d_{hkl}$ for nickel, nickel (II) oxide, and nickel carbide were calculated based on the lattice parameters obtained from. The measured distances were then compared to the calculated values and matched within 5% error. The phase assignment was verified by comparing the angle measured from the FFT pattern with the theoretical value for the obtained orientation, and further corroborated using the electron diffraction pattern in FIG. 3D.

Particle size. Particle sizes (see Table 1) were measured from a bright-field TEM image using ImageJ (FIG. 7). Confidence interval on the mean particle size was calculated assuming normal distribution of the particle sizes and unknown variance using t-distribution (n=40, α=0.05). Confidence interval on the variance of the particle size was calculated using $\chi^2$ distribution (n=40, α=0.05).

TABLE 1

Particle sizes collected from the bright-field TEM image (see FIG. 7)

| N | Size, nm |
|---|---|
| 1 | 37.24 |
| 2 | 19.47 |
| 3 | 33.79 |
| 4 | 25.29 |
| 5 | 30.55 |
| 6 | 17.24 |
| 7 | 31.06 |
| 8 | 19.04 |
| 9 | 33.05 |
| 10 | 19.86 |
| 11 | 16.73 |
| 12 | 19.59 |
| 13 | 19.03 |
| 14 | 20.41 |
| 15 | 22.85 |
| 16 | 26.94 |
| 17 | 17.43 |
| 18 | 18.98 |
| 19 | 23.25 |
| 20 | 22.16 |
| 21 | 15.15 |
| 22 | 19.26 |
| 23 | 16.61 |
| 24 | 12.52 |
| 25 | 12.14 |
| 26 | 16.59 |
| 27 | 25.43 |
| 28 | 16.6 |
| 29 | 16.61 |
| 30 | 17.98 |
| 31 | 14.29 |
| 32 | 27.28 |
| 33 | 12.82 |
| 34 | 29.34 |
| 35 | 21.67 |
| 36 | 14.88 |
| 37 | 18.95 |
| 38 | 19.95 |
| 39 | 21.81 |
| 40 | 30.72 |

Mechanical characterization. Uniaxial compression experiments were conducted using in situ nanomechanical instrument, SEMentor (InSEM; Nanomechanics and FEI Quanta 200). Samples were compressed using a diamond flat punch tip with a diameter of 170 μm at a constant strain rate of $10^{-3}$ s$^{-1}$. Relative density of each of the structures was calculated using a CAD model created in Abaqus with average unit cell sizes and beam diameters measured from the SEM images assuming fully-dense beams. Real-time deformation video and the mechanical data were simultaneously captured during the experiment (not provided).

Specific strength values shown in Table 2 were calculated as the lattice strength divided by the lattice density.

TABLE 2

Specific strength of metal lattices fabricated using metal AM processes.

| Material | Lattice Type | Process | Beam diameter, μm | Strength, MPa | Relative density | Material density, g/cm³ | Lattice density, g/cm³ | Specific strength, MPa/(g/cm³) |
|---|---|---|---|---|---|---|---|---|
| Ti—6Al—4V | Cubic | Electron Beam Melting (EBM) | 810 | 23.70 | 0.063 | 4.43 | 0.26 | 84.92 |
| | | | 970 | 34.70 | 0.078 | | 0.32 | 100.42 |
| | | | 1480 | 89.10 | 0.159 | | 0.65 | 126.50 |
| | | | 1780 | 180.20 | 0.216 | | 0.88 | 188.32 |
| Ti—6Al—4V | Topology-optimized | Selective Laser Melting (SLM) | 406 | 30.00 | | n/a | 0.50 | 60.00 |
| AlSi10Mg | Diamond | Direct Metal Laser Sintering (DMLS) | 405 | 1.42 | 0.050 | 2.67 | 0.12 | 10.63 |
| | | | 502 | 4.72 | 0.075 | | 0.17 | 23.54 |
| | | | 659 | 8.54 | 0.100 | | 0.23 | 31.98 |
| | | | 765 | 12.61 | 0.125 | | 0.29 | 37.76 |
| | | | 862 | 17.40 | 0.150 | | 0.35 | 43.45 |
| Stainless steel 316L | BCC | Selective Laser Melting (SLM) | 162 | 0.20 | 0.023 | n/a | 0.19 | 1.05 |
| | | | 181 | 0.33 | 0.029 | | 0.23 | 1.43 |
| | | | 181 | 0.33 | 0.029 | | 0.23 | 1.43 |
| | | | 197 | 0.45 | 0.034 | | 0.28 | 1.61 |
| | | | 197 | 0.45 | 0.035 | | 0.28 | 1.61 |
| | | | 212 | 0.58 | 0.040 | | 0.32 | 1.81 |
| | | | 212 | 0.60 | 0.041 | | 0.33 | 1.82 |
| | | | 186 | 0.38 | 0.031 | | 0.25 | 1.52 |
| | | | 210 | 0.55 | 0.039 | | 0.31 | 1.77 |
| | | | 230 | 0.79 | 0.047 | | 0.38 | 2.08 |
| | | | 249 | 1.00 | 0.055 | | 0.44 | 2.27 |
| | | | 165 | 0.32 | 0.030 | | 0.24 | 1.33 |
| | | | 166 | 0.33 | 0.032 | | 0.26 | 1.27 |
| | | | 186 | 0.47 | 0.036 | | 0.29 | 1.62 |
| | | | 188 | 0.46 | 0.034 | | 0.28 | 1.64 |
| | | | 222 | 0.83 | 0.047 | | 0.38 | 2.18 |
| | | | 211 | 0.73 | 0.043 | | 0.34 | 2.15 |
| Silver | Octahedral | Pointwise Spatial Printing | 35 | 0.60 | 0.065 | n/a | 0.50 | 1.20 |
| | | | 38 | 1.27 | 0.270 | | 1.74 | 0.73 |
| NiTi | Octahedral | Selective laser melting (SLM) | 248 | 21.00 | 0.252 | 6.45 | 1.63 | 12.92 |
| | Cellular gyroid | | 298 | 29.00 | 0.252 | | 1.63 | 17.84 |
| | Sheet gyroid | | 210 | 44.00 | 0.266 | | 1.72 | 25.65 |
| Nickel | Octet | This work | 0.30 | 18.17 | | 8.91 | 2.52 | 7.20 |
| | | | 0.30 | 17.08 | | | 2.55 | 6.71 |
| | | | 0.28 | 8.91 | | | 2.60 | 3.42 |
| | | | 0.27 | 8.18 | | | 2.75 | 2.98 |

Pyrolysis was performed in a tube furnace following a two-step procedure: (1) at 1000° C. to remove most of the organic content from the samples and to consolidate the Ni metal clusters into denser features, which is accompanied by ~5× linear shrinkage in feature size and (2) at 600° C., to reduce the oxygen content in the mostly-Ni samples and to facilitate grain growth. SEM images in FIG. 1I-J show a representative 3D Ni architecture and convey that the 10 μm unit cells and 2 μm-diameter beams in the original polymer-metal structure shrank to ~2 μm unit cells and ~300-400 nm diameter beams in the nickel nanolattice. This also implies that 150 nm layer thickness in the polymer structure corresponds to 30 nm layer thickness in the metal structure. The zoomed-in image in FIG. 1J shows that the metal beams are ~10%-30% porous caused by pyrolysis.

Figure 2A:
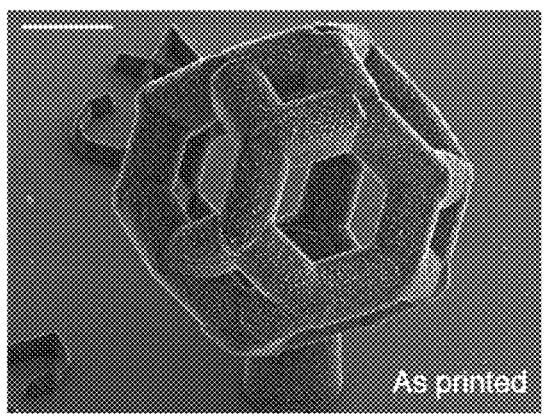
FIG. 2A-H shows Energy Dispersive Spectroscopy (EDS) characterization of fabricated metal nanostructures. SEM images of supported 20 μm tetrakaidekahedron unit cell on a Si chip before pyrolysis and (B) the same structure after pyrolysis (4 μm width). (C) SEM image of the structure showing where EDS data was collected. (D) EDS spectrum taken within the beam of the structure suggests that the chemical composition is more than 90 wt % nickel. (E-H), EDS maps show high uniformity of the atomic composition throughout the structure. Scale bars are 5 μm for (A) 1 μm for (C) and 2 μm for (D), (E-H).
Figure 2B:
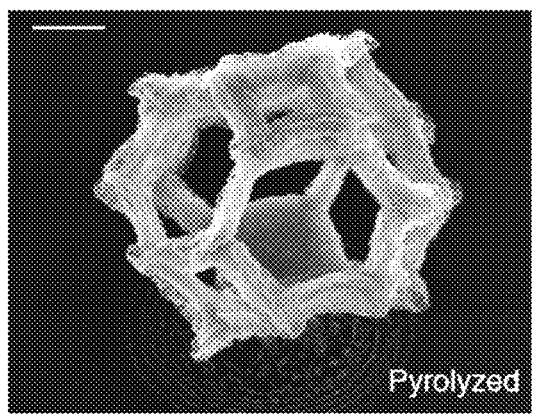
Figure 2C:
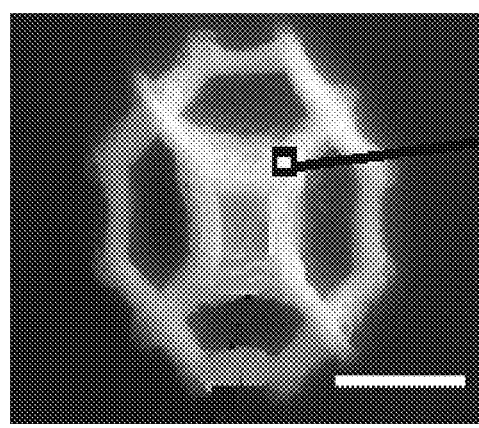
Figure 2D:
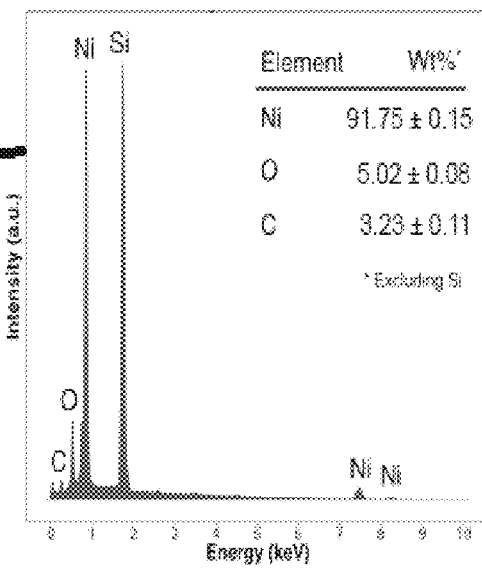
Figure 2E:
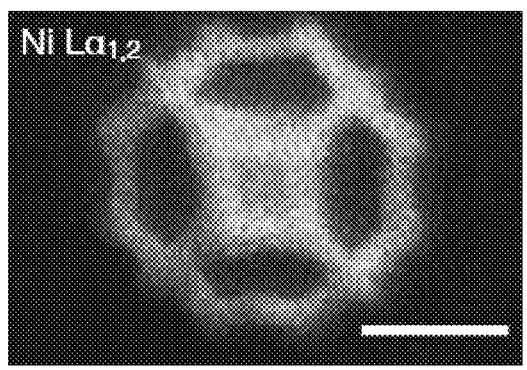
Figure 2F:
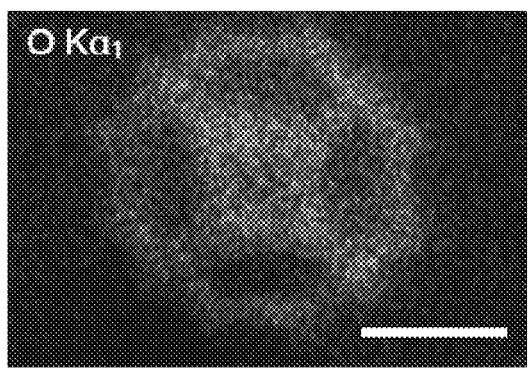
Figure 2G:
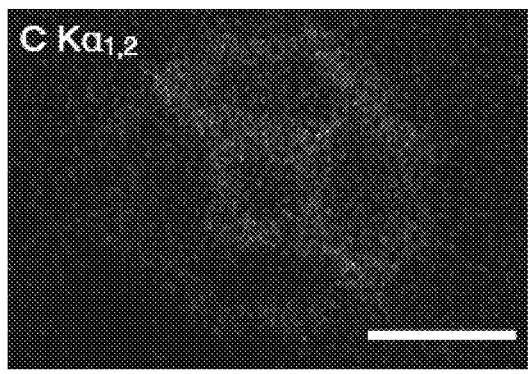
Figure 2H:
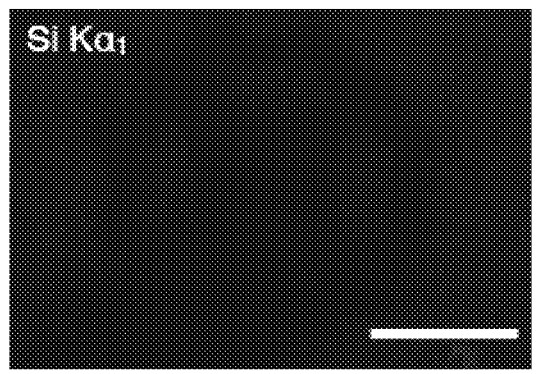

Chemical composition of the as-fabricated Ni architectures was characterized using Energy-Dispersive X-Ray Spectroscopy (EDS), for which individual unit cells were fabricated with tetrakaidecahedron geometries using the same methodology. FIG. 2A shows that these structures shrunk from 20 μm-wide unit cells and 2 μm-diameter beams on 6 μm pillar supports to 4 μm unit cells and 0.4 μm-diameter beams after pyrolysis (FIG. 2B). EDS spectrum (FIG. 2D) taken from a beam section shown in FIG. 2C reveals the chemical composition to be 91.8 wt % Ni, 5.0 wt % 0, and 3.2 wt % C. A Si peak from the substrate is also present. EDS maps in FIG. 2E-H convey a relatively homogeneous distribution of each element within the printed structure, which consists mostly of nickel metal and is not segregated into individual nickel-, carbon-, or oxygen-rich phases.

Figure 3B:
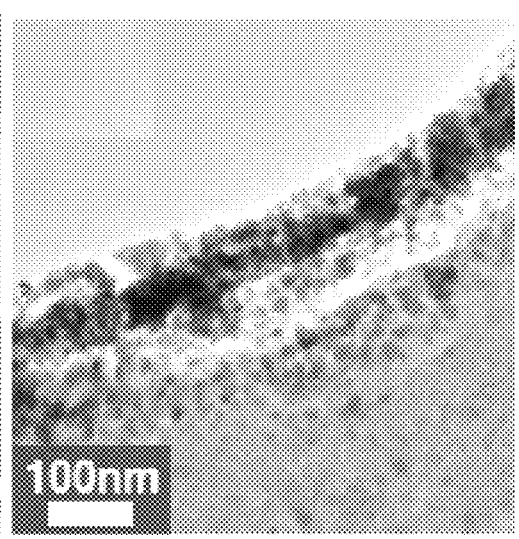

A few-micron long, 25-100 nm-diameter metal beams that spanned the 1.25 μm-wide opening in a silicon nitride membrane were fabricated directly on the Transmission Electron Microscopy (TEM) grids (FIG. 3A) to analyze the atomic-level microstructure of pyrolyzed materials. FIG. 3B displays a bright-field TEM image taken along a portion of that beam that reveals multiple coalesced grains with mean size of 21.4±2.0 nm.

Figure 3C:
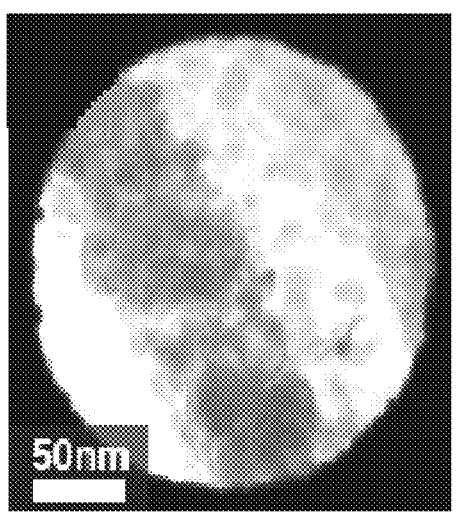
Figure 3D:
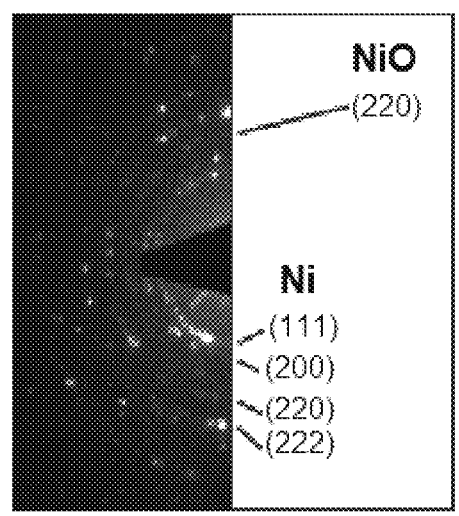
Figure 3E:
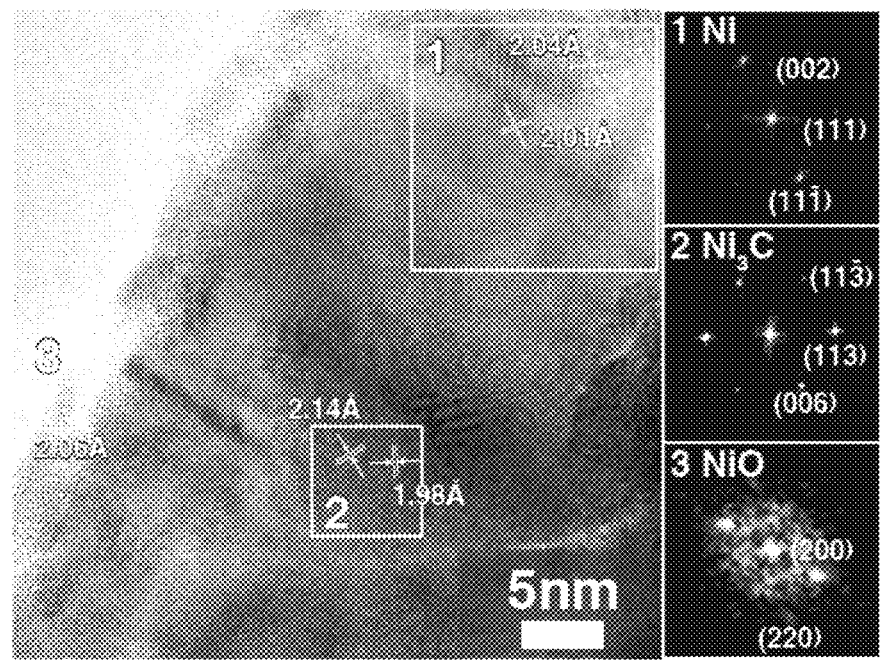
Figure 3F:
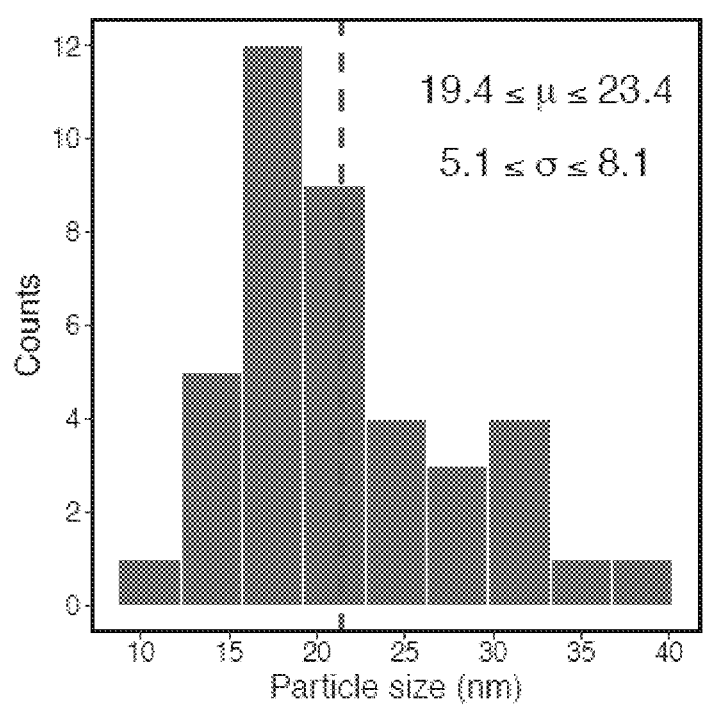

The electron diffraction pattern (FIG. 3D) taken from the region shown in FIG. 3C conveys a strong Ni signal and a much weaker contribution from NiO. A representative high-resolution TEM (HRTEM image (FIG. 3E) of the beam edge contains multiple lattice fringes, which allowed the calculation of interplanar atomic spacings using Fast Fourier transform (FFT). Three distinct spacings were identified: Ni crystals (region 1, spacings of 2.01 Å and 2.04 Å), Ni3C particles (region 2, spacings of 1.98 Å and 2.14 Å), and NiO crystals (region 3, spacing of 2.06 Å). Bright-field TEM revealed that Ni crystals occupy >90% of the examined volume, NiO<10%, and $Ni_3C$<1%, consistent with EDS results. TEM analysis further revealed the presence of nickel (II) oxide nanoparticles with diameters of <5 nm at the surface that were likely formed through surface oxidation in air after sample preparation. The pyrolysis is equivalent to carbothermal reduction at 1000° C. followed by hydrogen and carbothermal reduction at 600° C., with no oxygen present in the flowing gas. Literature on this type of thermal treatment reported the composition to be mainly metallic nickel with a minor amount of nickel carbide and/or carbon.

Figure 4A:
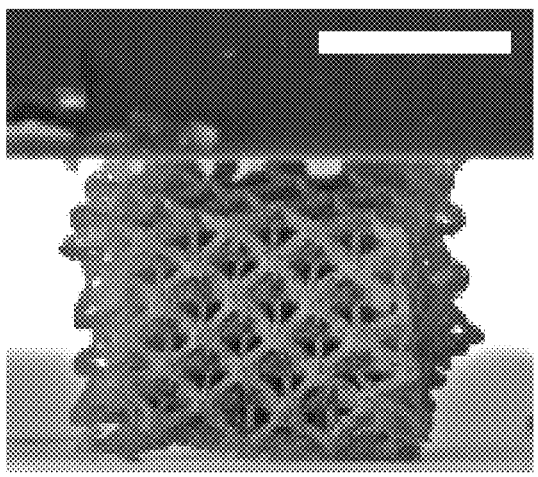
FIG. 4A-F shows in-situ uniaxial compression of 3D printed nickel octet nanolattices. (A)-(D), SEM images of the nickel structure during the compression test a, before full contact, (B) in the elastic regime, (C) during layer-by-layer collapse, and (D) during densification. (E) Stress-strain diagram showing compression of four nickel nanolattices. Letters on the graph correspond to the regions represented by (A)-(D). (F) Specific strength-beam size plot showing properties of nickel nanolattices compared to other metal lattices fabricated using Selective Laser Melting (SLM), Direct Metal Laser Sintering (DMLS), Electron Beam Melting (EBM), and ink-based methods. Scale bars are 5 μm for (A)-(D).
Figure 4B:
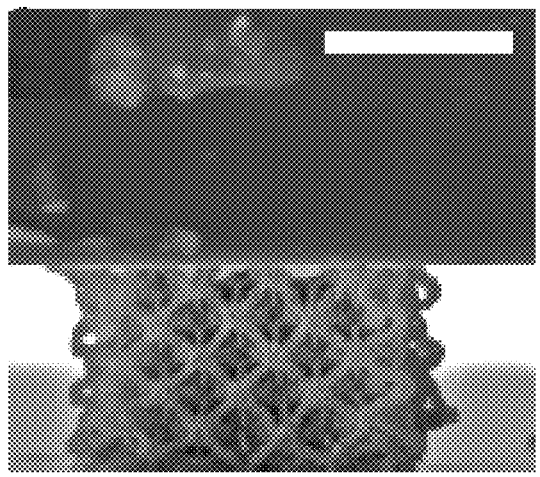
Figure 4C:
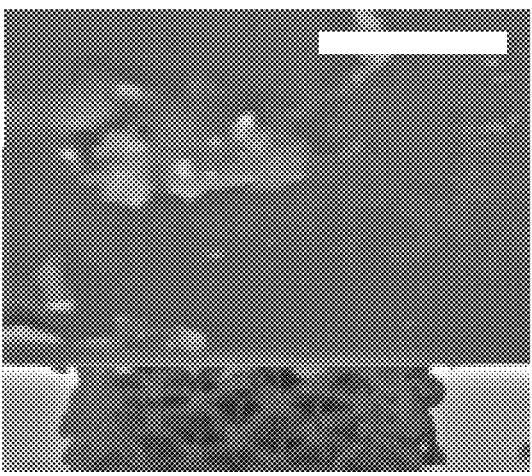
Figure 4D:
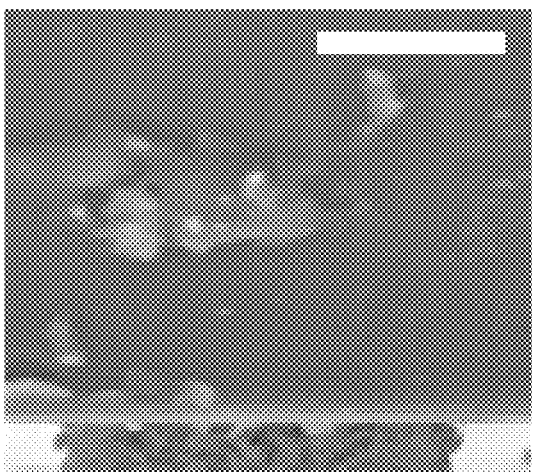
Figure 4E:
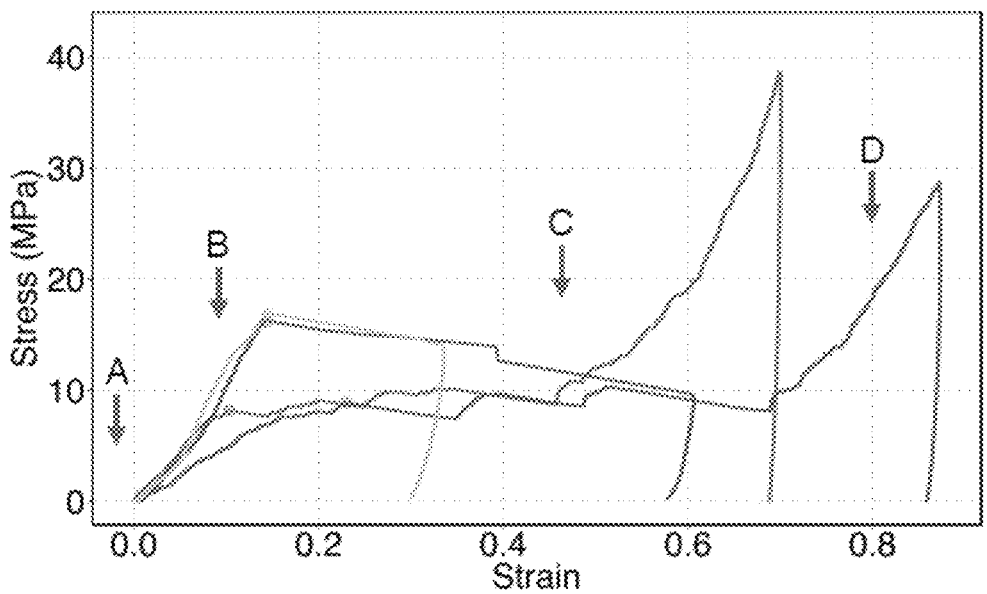

Uniaxial compression experiments were performed on four Ni octet nanolattices with relative densities of ~28-31% and beam sizes of 300-400 nm. The experiments were conducted in-situ, in a SEM-based nanomechanical instrument, comprised of a nanoindenter-like module (Nanomechanics, Inc.) inside of SEM chamber (Quanta 200 FEG, FEI), which enabled observing the deformation while simultaneously collecting load vs. displacement data. The collected data was converted into engineering stresses and strains by dividing the load by the sample footprint area and dividing the displacement by the sample height, respectively. FIG. 4A-D shows SEM snapshots obtained during a compression experiment of a representative sample together with the stress vs. strain data (FIG. 4E). The stress vs. strain data was typical for cellular solids compressions, with the characteristic elastic loading, plateau, and densification sections. The arrows on the plot in FIG. 4E are correlated with the images in FIG. 4A-D and demarcate specific stages during compression: initial contact (region A), elastic deformation (region B), layer-by-layer collapse (region C), and densification (region D). A toe region in the initial portion of each experiment (not shown) is representative of deformation before establishing full contact between the sample and flat punch indenter tip. The point of full contact was determined using harmonic contact stiffness and SEM video. The slope of the elastic loading segment, up to 10-15% strain (region B), was used to estimate structural stiffness of the nanolattices, which ranged from ~53 to 174 MPa. The strength of Ni nanolattices was defined as the maximum stress prior to the first buckling event, marked by open circles in the data in FIG. 4E, and ranged from 8.2 MPa to 18.2 MPa. The elastic region was followed by layer-by-layer layer collapse up to 65% strain (region C); two of the four samples were unloaded at 30 and 60% strain. The two remaining samples were compressed to 70-85% strains, reached densification (region D) and then unloaded. None of the nanolattices recovered after deformation.

Figure 4F:
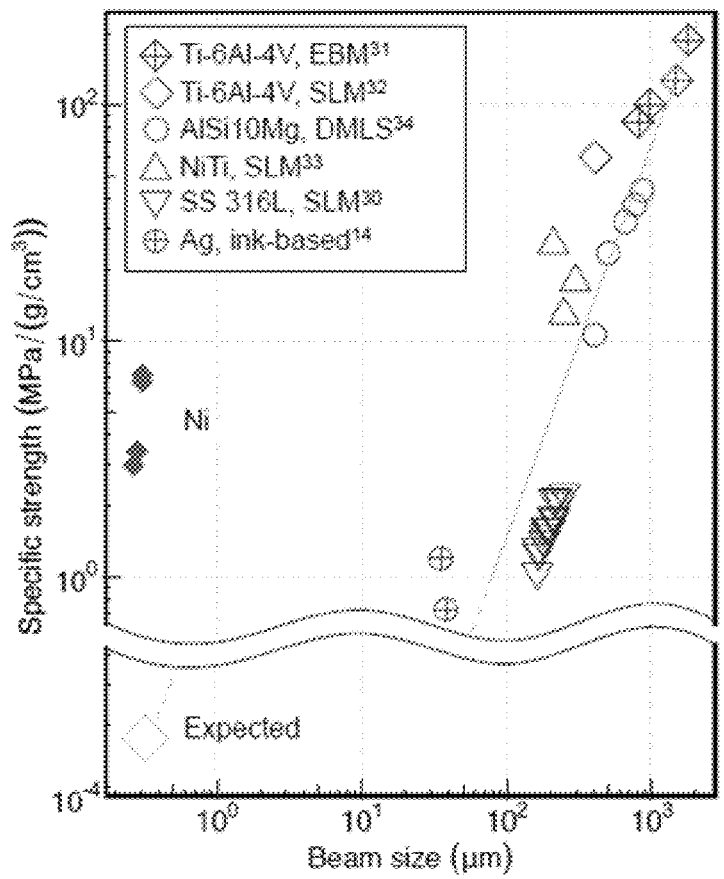

FIG. 4F shows the specific strength of Ni nanolattices fabricated in this work and those of the metallic lattices fabricated using other metal AM processes as a function of beam diameter on a log-log plot (see Table 2). Nanocrystalline Ni nanolattices of the disclosure have the specific strength of 3.0-7.2 $MPa/(g/cm^3)$, which is an order of magnitude higher than that of octahedral silver lattices with ~40 μm-diameter beams and ~3-7× higher than the stainless steel lattices with ~200 μm-diameter beams described in the literature. It appears to be on the same order as NiTi octahedral lattices with ~250 μm-diameter beams and AlSi10Mg diamond lattices with ~400 μm beams. This suggests that the AM process described here is capable of producing architectures with feature sizes that are an order of magnitude smaller than those fabricated using existing AM processes while retaining high strength. This is in contrast to all other existing metallic lattices whose strength rapidly deteriorates with slenderer beams. This trend was used to extrapolate the specific strength of lattices with beams smaller than 40 μm and found that nickel nanolattices are more than four orders of magnitude stronger than what is expected for architectures with 0.3 μm features (FIG. 4F). This strength of Ni nanolattices represents a lower bound because the 10-30% residual porosity lowers the compressive strength and leads to high sample-to-sample variation.

Figure 5:
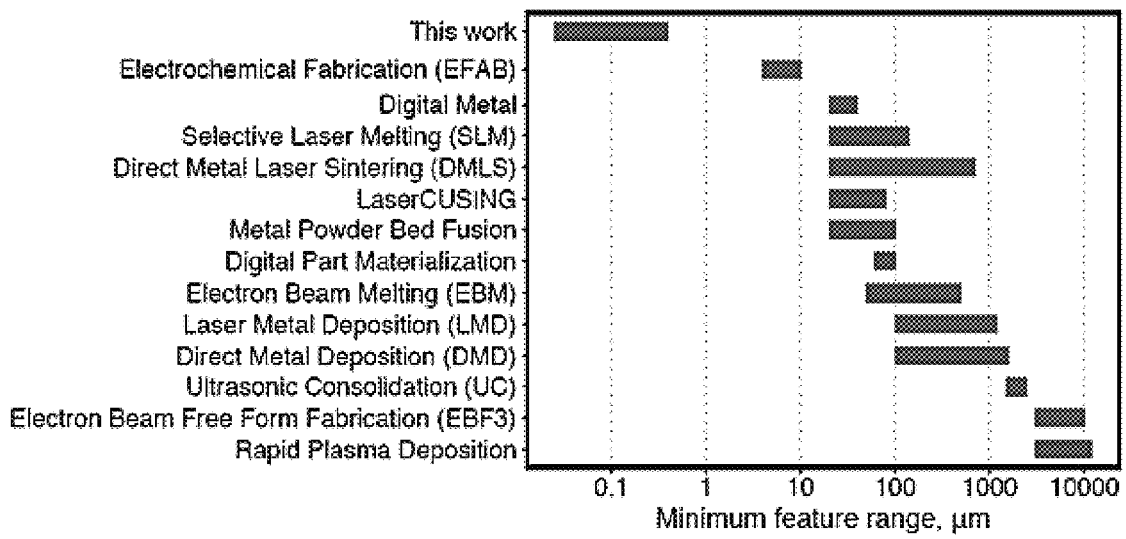
FIG. 5 shows a comparison of minimum feature sizes for scalable metal additive manufacturing technologies. Using metal-containing photoresist allows to fabricate complex 3D geometries with the resolution that is an order of magnitude finer than that of the state-of-the-art metal AM methods.

FIG. 5 shows minimal reported printed feature sizes enabled by this method and some other metal AM processes available today. The plotted ranges include both layer thickness and minimum lateral feature size. The minimum z-feature is determined by the resolution of a single layer of material. The minimum lateral feature is defined by multiple factors, which include the energy beam spot size and control over the melt pool. The data in FIG. 5 demonstrates that the AM process developed in this work is capable of producing features that are an order of magnitude smaller compared to those produced by other 3D-capable AM processes. Another key aspect of any metal AM process is the throughput. Using hybrid organic-inorganic photoresist developed in this work allows for writing speeds of 4-6 mm $s^{-1}$, which is ~100 times faster than that for TPL of metal salts. For a typical 300-600 nm feature size printed by TPL35, this corresponds to defining 6700-20000 voxels $s^{-1}$, a printing speed that is out of reach for state-of-the-art micro-scale metal AM techniques, i.e. electrohydrodynamic printing (0.05-300 voxels $s^{-1}$), local electroplating (0.04-1.0 voxels $s^{-1}$), focused beam methods (0.01-0.8 voxels $s^{-1}$), and direct ink writing (0.7-3000 voxels $s^{-1}$). High scanning speeds and intrinsic advantage of parallelizing light delivery using lithographic methods suggest that the presented AM process lends itself to efficient scalable manufacturing of metal nano-architectures.

Example 2

Acrylic acid (anhydrous, 99%), titanium(IV) ethoxide (>97%), propylene glycol monomethyl ether acetate (PGMEA) (>99.5%), and isopropyl alcohol (IPA) (99.7%) were purchased from Sigma Aldrich. Acrylic acid (17.3 g) was slowly added to titanium(IV) ethoxide (13.7 g) in a glovebox (FIG. 8A), and the solution was manually agitated. The color of the solution changed from yellow to orange, which is indicative of a ligand exchange reaction. This mix was then placed in a vacuum antechamber of the glovebox for 15 min to remove excess ethanol. The resulting solution was taken out of the glovebox and mixed with 87.7 g of an open-source Autodesk PR48 formulation (39.776 wt % Allnex Ebecryl 8210, 39.776 wt % Sartomer SR 494, 0.4 wt % 2,4,6-Trimethylbenzoyl-diphenylphosphineoxide, 19.888 wt % Rahn Genomer 1122, 0.160 wt % 2,2'-(2,5-thiophenediyl) bis(5-tertbutylbenzoxazole); Colorado Photopolymer Solutions) and stirred at room temperature for 1 hr.

Figure 8A:
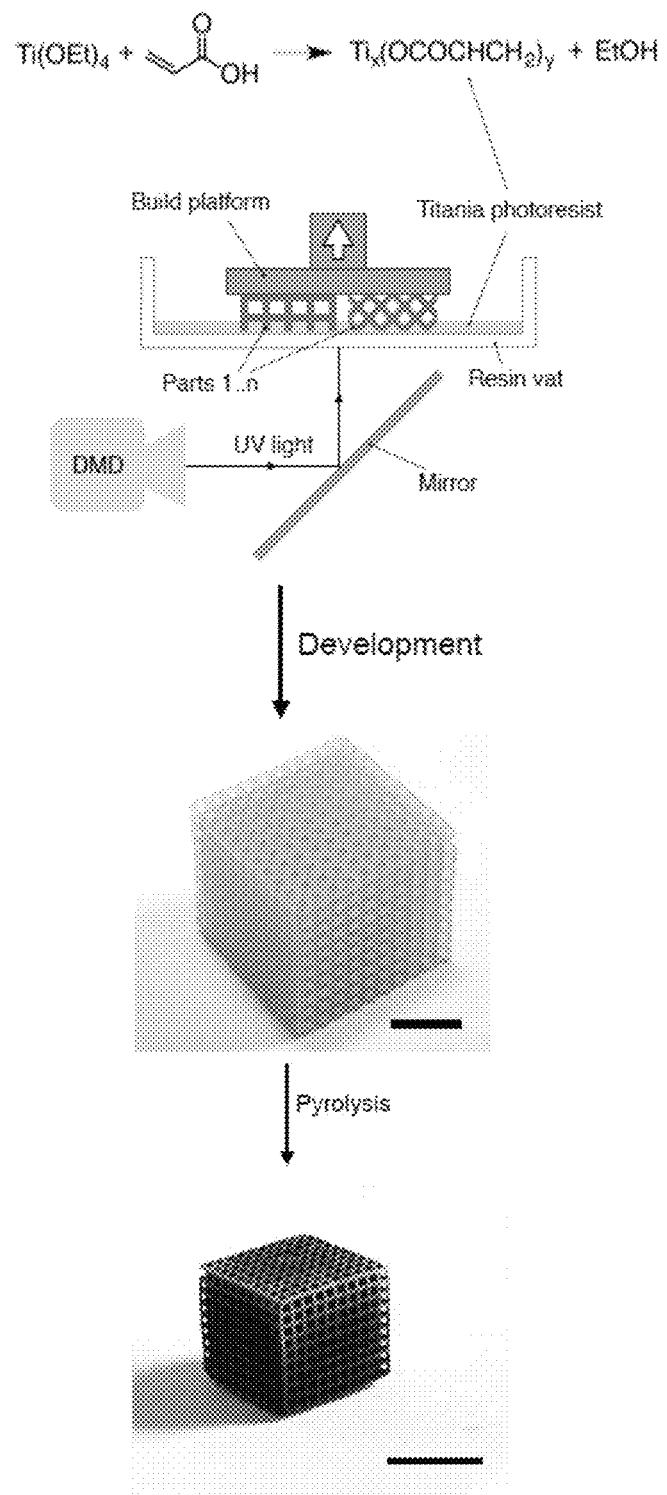
FIG. 8A-E shows a process for AM of titania and SEM characterization of printed titania structures. (A) Shows ligand exchange reaction to add acrylic functional groups onto titanium clusters followed by a schematic of the SLA instrument to pattern titanium-containing photoresist into complex 3D geometries. Optical images of a cubic lattice made from titanium-containing polymer before and after pyrolysis. (B) Top view of a titania octet lattice (optical image). SEM images of (C) a representative node in the unit cell of an octet lattice and (D, E) titania nano-crystallites on the surface of the structure. Scale bars are 5 mm for (A), 2 mm for (B), 100 μm for (C), 5 μm for (D), and 500 nm for (E).

A stereolithography-based 3D printer (Autodesk Ember) was used to pattern the synthesized titanium-rich photoresist using a layer-by-layer approach with 25 μm layer thickness (FIG. 8A). Structures with different geometries were printed, with the UV exposure of the first layer for 14.0 s, four consequent layers for 9.0 s, and all remaining layers for 3.5 s. Printed structures were developed in PGMEA for 15 min, followed by IPA wash for 10 min. FIG. 8A shows a representative titanium-containing polymer scaffold after development.

The final step in this AM process involved placing the printed titanium-containing polymer structures on a fused quartz boat and pyrolyzed in a tube furnace using 4" quartz tube under 1 L/min argon flow. The temperature was ramped up to 1000° C. at 2° C./min, kept at 1000° C. for 1 hour, and cooled down to room temperature at a natural rate. FIGS. 8A (bottom) show representative titania structures after pyrolysis.

Figures 8B, 8C:
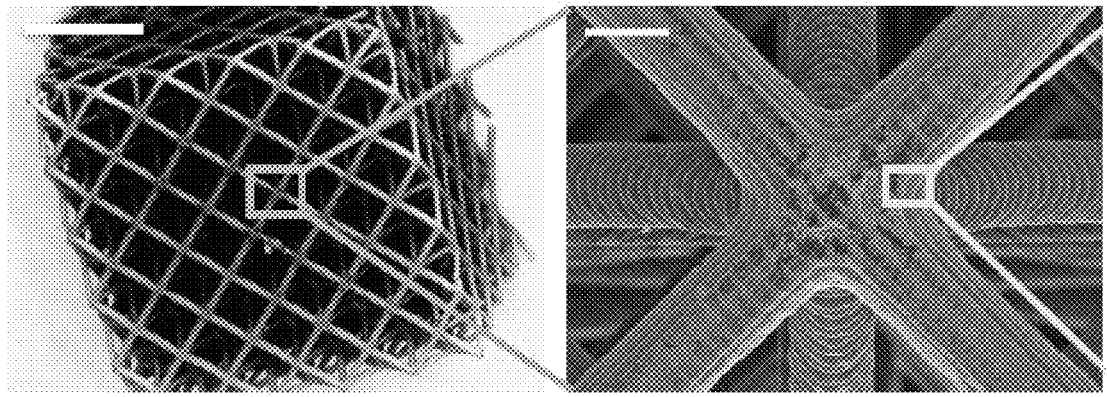

Samples were fabricated in two geometries: (1) 10×10×10-unit cell cubic lattices with unit cell dimensions of 1.16±0.10 mm and beam diameters of 393±17 μm (FIG. 8A) and (2) 5×5×5-unit cell octet lattices with 1.71±0.17 mm unit cell dimensions and 179±5 μm beam diameters. These samples had relative densities that range from 11% to 31%. All samples were pyrolyzed in Ar atmosphere at 1000° C., which led to linear shrinkage of 39.0±5.9% and a mass loss of 74.2±2.5%. The final products were cubic titania lattices with unit cell sizes of 0.66±0.01 mm and beam diameters of 170±5 μm (FIG. 8A) and octet lattices with unit cell sizes of 1.14±0.01 mm and beam diameters of 115±4 μm (FIG. 8B). These 3-dimensional titania architectures appeared white, blue (, black and other colors, which likely stems from (i) a change in the visible light absorption of titania as a function of doping with carbon, sulfur and nitrogen, all of which are present in the initial photoresist, and (ii) a contribution to the light absorption by the residual carbon.

Figures 8D, 8E:
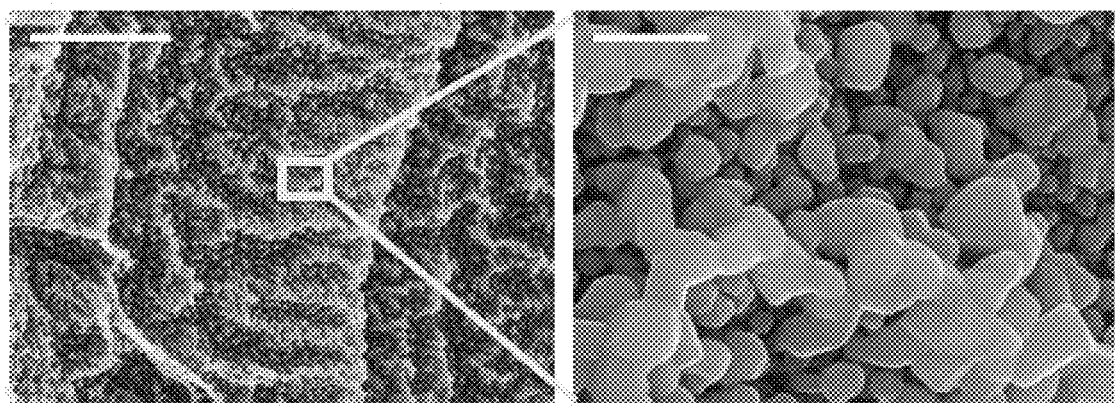
Figures 9A, 9B:
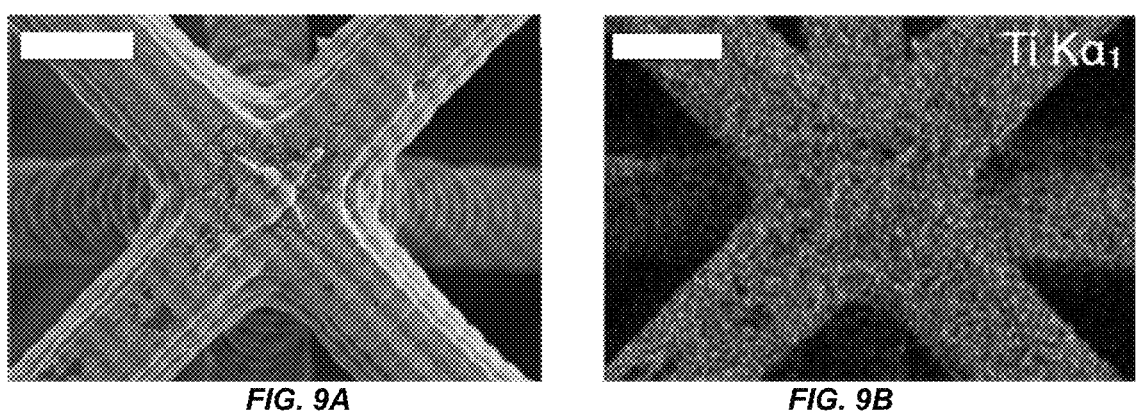
FIG. 9A-F shows EDS and Raman characterization of printed titania structures. (A) SEM image of an octet lattice node where EDS maps were taken. EDS maps show uniform distribution of (B) titanium, (D) oxygen, and (E) carbon within the structure. (C) EDS spectrum taken from one of the beams shows mostly titanium and oxygen content by weight. (F) Raman spectrum of a 3D printed structure compared to reference spectra of anatase and rutile TiO2 indicates mostly rutile phase of titania. Scale bars are 100 μm for (A), (B), (D), and (E).
Figure 9C:
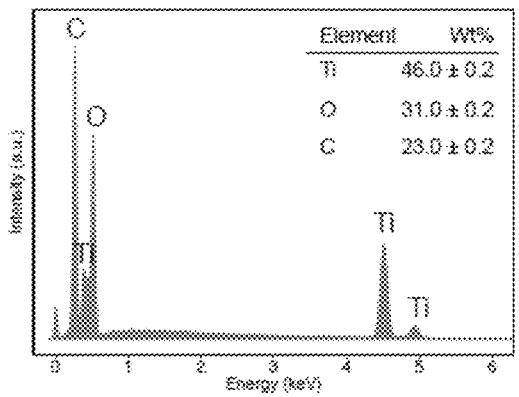
Figure 9D:
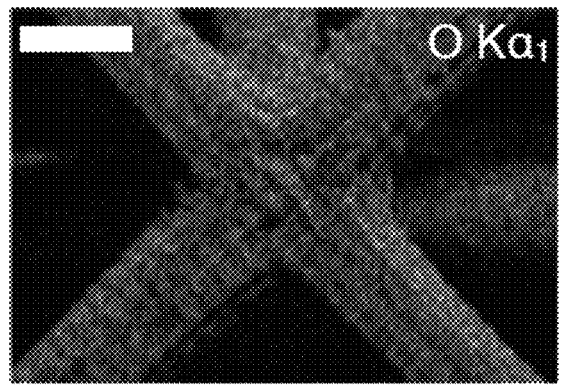
Figure 9E:
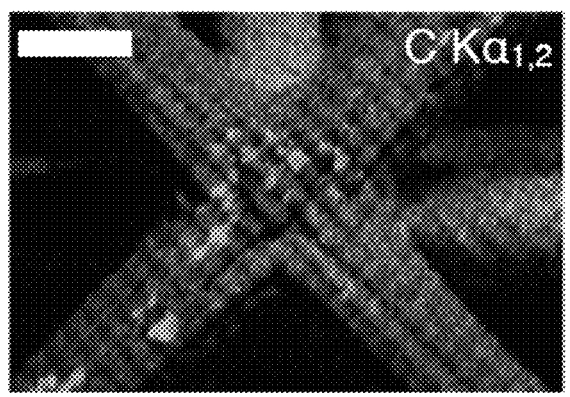
Figure 9F:
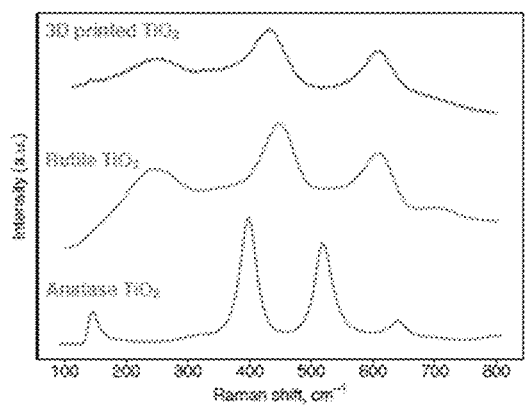
Figure 10A:
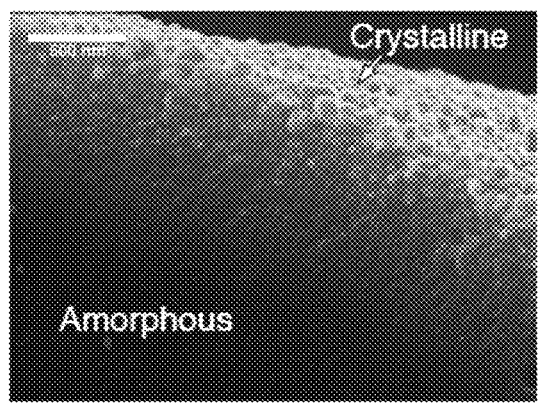
FIG. 10A-F shows TEM and SEM characterization of 3D printed titania structures. (A) SEM image of a beam cross-section shows that the size of titania crystals gets smaller closer to the beam center. (B) Histogram showing distribution of titania particle sizes measured from TEM images. (C) HRTEM image showing titania particles. FFT analysis was used to determine the orientation and lattice spacings for one of the crystals. (D) Low-magnification TEM image of titania nanoparticles from the printed structure. (E) TEM image of the area where electron diffraction pattern was taken. (F) Electron diffraction pattern indicates mostly rutile titania.
Figure 10B:
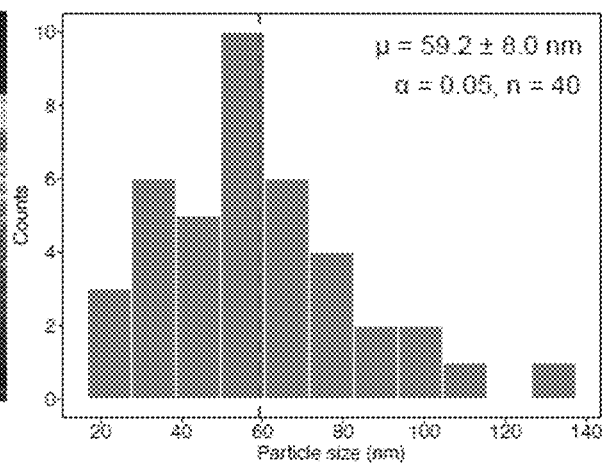
Figure 10C:
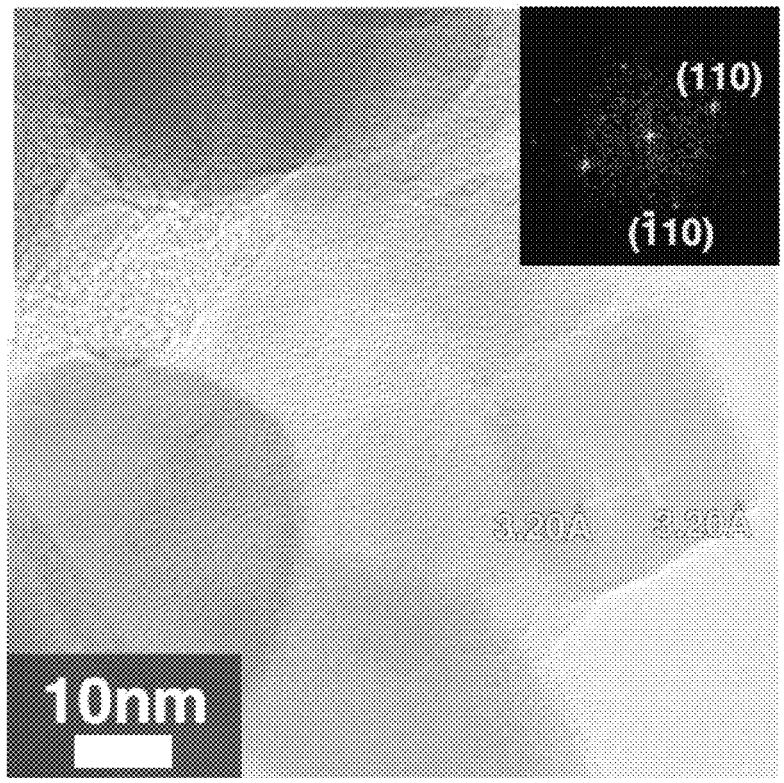
Figure 10D:
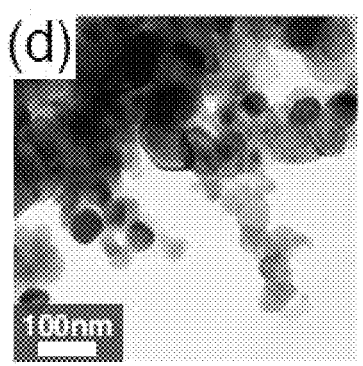
Figure 10E:
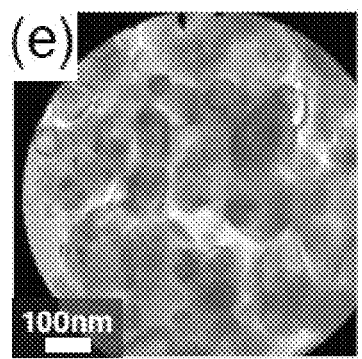
Figure 10F:
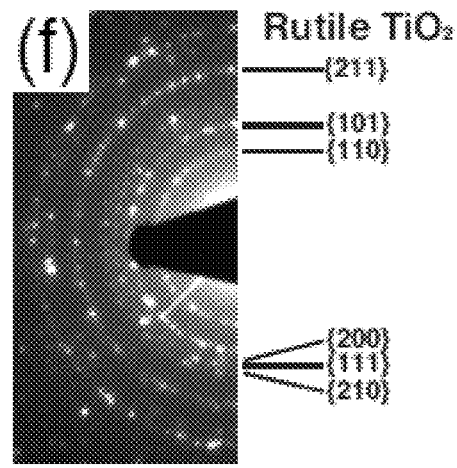

FIG. 8C-E show Scanning Electron Microscopy (SEM) (FEI Versa 3D DualBeam) images of the resulting morphology of the pyrolyzed titania octet lattices at different magnifications. These images reveal uniformly sized unit cells and beams with visible layer-to-layer transition patterns, which are inherent for the utilized SL printer (FIG. 8C). The surface of the structure is covered by porous nanocrystalline formations with clearly visible facets and crystals ranging from 20 to 150 nm in size (FIG. 8D-E). SEM Energy-Dispersive X-Ray Spectroscopy (EDS) characterization was conducted with Zeiss 1550VP FESEM equipped with Oxford X-Max SDD using a 10 kV electron beam. FIGS. 9A-B and D shows EDS maps of the of the pyrolyzed titania lattices, which convey a uniform distribution of Ti, O and C throughout the structure. This EDS spectrum suggests a chemical composition of 46 wt % of Ti, 31 wt % of 0, and 23 wt % of C (FIG. 9C). Raman spectroscopy (Renishaw M1000 MicroRaman Spectrometer, 514.5 nm laser) conducted on the surface of the pyrolyzed samples showed predominantly rutile signature (FIG. 9F).

FIG. 10 shows the results of microstructural analysis performed on a compressed titania lattice in a Transmission Electron Microscope (FEI Tecnai F30ST, 300 kV). The sampled titania particles, most likely, belong to the beam surface, since the crystal size considerably diminishes further away from the surface of the structure, as seen on an SEM image of a beam cross-section (FIG. 10A). TEM images reveal the presence of $TiO_2$ crystals (FIG. 10D) with a mean crystal size of 59.2±8.0 nm (see FIG. 10B for particle size histogram). Electron diffraction pattern from a mostly crystalline region of the sample (FIG. 10E) corroborates rutile titania as the predominant phase (see FIG. 10F). High-resolution TEM image in FIG. 10C demonstrates the presence of crystalline and amorphous regions within the sample. FFT analysis of a crystalline region confirms the material to be rutile $TiO_2$, with 3.20 Å lattice spacing that corresponds to (110) and (1̄10) orientations (FIG. 10C, top right). Amorphous regions closer to the beam center correspond to $TiO_{1-x}C_x$, with oxygen content varying as a function of depth, as observed on an EDS line spectrum of a beam cross-section.

Figure 11A:
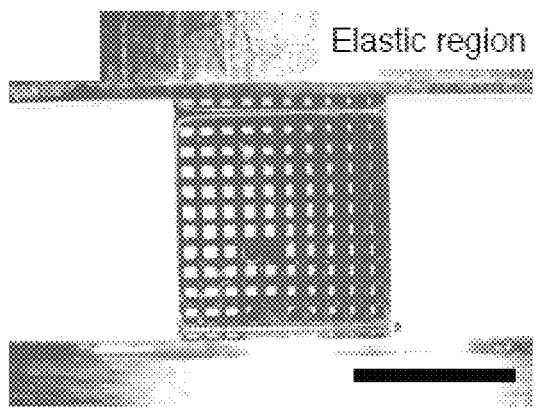
FIG. 11A-E shows uniaxial compression test of printed titania cubic lattices. (A-D) Optical images of the structure during uniaxial compression showing different stages during the compression test: elastic region (A), followed by brittle failure of the first layer (B, C) and gradual brittle failure of individual beams and layers (D). (E) Stress-strain data for three cubic lattices. Scale bars for (A-D) are 5 mm.
Figure 11B:
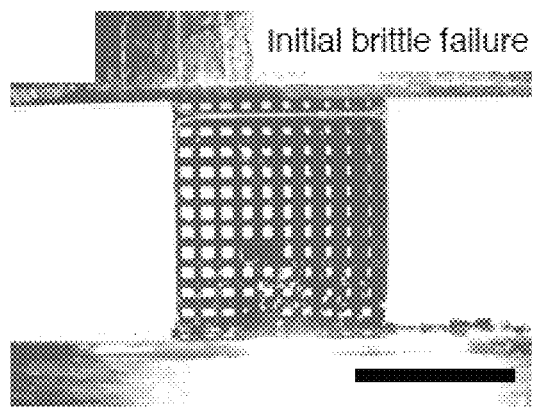
Figure 11C:
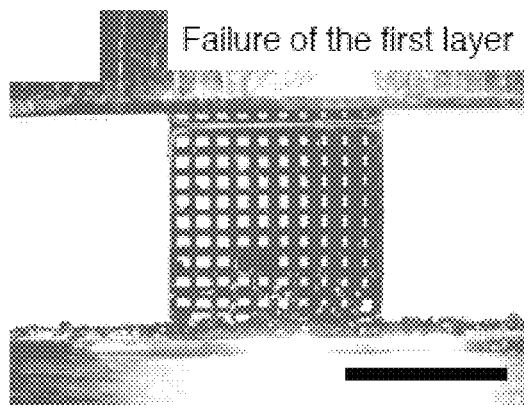
Figure 11D:
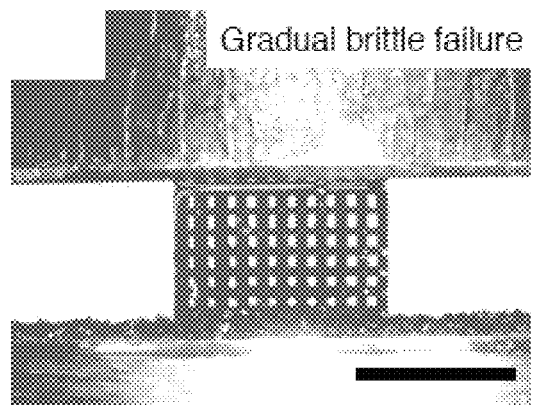
Figure 11E:
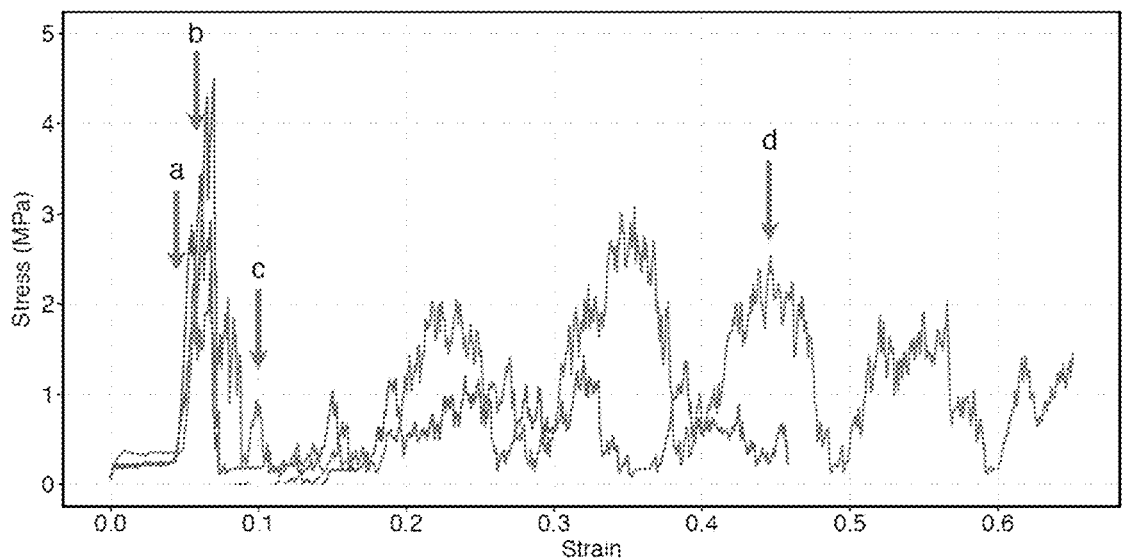

Uniaxial compression tests on pyrolyzed cubic lattices were performed using Instron 5569 electromechanical testing machine equipped with an Instron 2525-802 load cell (R.C. 50 kN) at a displacement rate of 0.15-0.5 mm/min. The collected load vs. displacement data was converted into engineering stresses and strains using the height and the footprint of the structure measured from optical images before compression. FIG. 11 shows optical images of the structure during compression (FIG. 11A-D) and representative stress-strain data (FIG. 11E). This data demonstrates that each compression began with a toe region corresponding to the sample settling into full contact followed by linear elastic regime up to 1-2% strain. Further compression resulted in gradual brittle failure of individual beams and unit cells (see FIG. 11E).

The loading slope was used to calculate the structural elastic modulus to be 0.21-0.37 GPa. The strength was measured as the maximum stress achieved during initial elastic loading and ranged from 2.1 to 4.3 MPa. These strengths and moduli are comparable to strongest reported titania foams with 2× higher densities, up to 2.5 MPa at 700 kg/m³, and 2.1 to 5.6 times stronger than titania foams with comparable densities (0.8-1.0 MPa at 350 kg/m³). The mechanical properties of the architected titania lattices in this work may be further improved by using a high-temperature annealing step (1500° C.) that would induce better sintering of titania particles.

Example 3

Figure 12A:
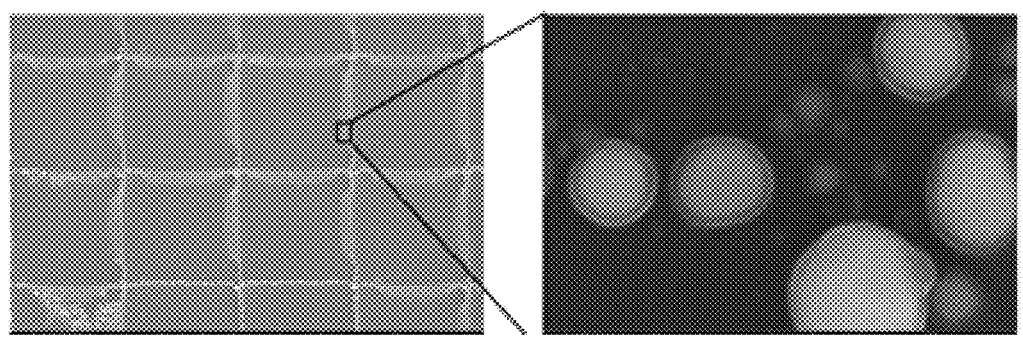
FIG. 12A-B shows 2D patterning of NiNPs. (A) Grid pattern of NiNPs on Si after removing the organic content from a lithographically-defined grid structure. (B) Carbon nanotube (CNT) synthesis using pre-patterned NiNPs on Si.
Figure 12B:
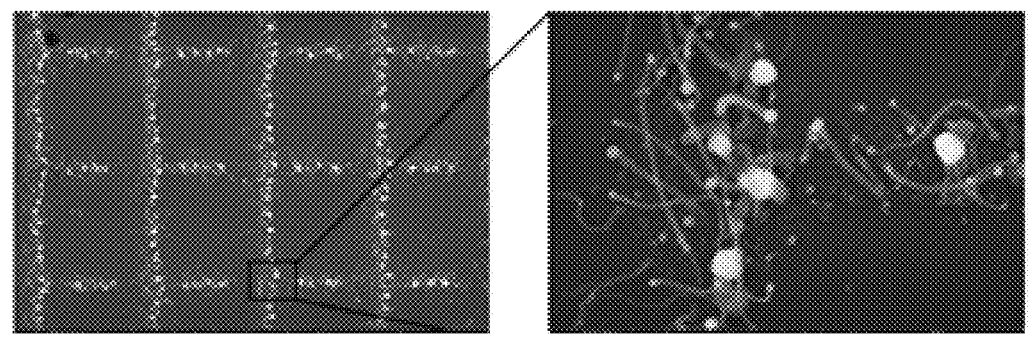

Spatial control of catalytic synthesis of carbon nanotubes (CNTs) was accomplished using a pattern of nickel NPs. A preparation of a nickel-containing resin (see above) was used. Grid patterns were defined with 5 μm unit cell and 150 nm line thickness on a silicon chip using two-photon lithography. The photoresist pattern was pyrolyzed in argon atmosphere at 900° C., yielding a pattern of 20-150 nm nickel nanoparticles (NiNPs) encapsulated in carbon (FIG. 12A). The NiNP pattern was further process in a forming gas at 900° C. to grow CNTs using the residual solid carbon source (FIG. 12B).

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:
1. A method for manufacturing a sub-micron architectural material, comprising
patterning a hybrid organic-inorganic polymer resin comprising photopolymerizable functional groups and having the general structure:

where M is a metal, a metal ion, a metalloid, a metal alloy, a metal oxide, a metal nitride, an inorganic, an inorganic-organic hybrid and/or metal-inorganic composite material, wherein R is a $C_{2-10}$ terminal alkene and R' is N, O, F, S or Cl and wherein n is 1, 2, 3, 4, 5 or 6, in the presence of a photoinitiator using a single or two photon lithography technique to polymerize the polymer resin and generate the sub-micron architectural material having desired characteristic dimension of about 5 nm to 5 micron across.

2. The method of claim 1, wherein the hybrid organic-inorganic polymer resin has the formula R—COR'-$M^{2+}$-R'OC—R, wherein M is a divalent metal ion, alloy, or inorganic material, R is a $C_{2-10}$ terminal alkene and R' is N, O, F, S or Cl.

3. The method of claim 1, wherein the metal ion is selected from the group consisting of $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Sc^{3+}$, $Sc^{2+}$, $Sc^+$, $Y^{3+}$, $Y^{2+}$, $Y^+$, $Ti^{4+}$, $Ti^{3+}$, $Ti^{2+}$, $Zr^{4+}$, $Zr^{3+}$, $Zr^{2+}$, $Hf^{4+}$, $Hf^{3+}$, $V^{5+}$, $V^{4+}$, $V^{3+}$, $V^{2+}$, $Nb^{5+}$, $Nb^{4+}$, $Nb^{3+}$, $Nb^{2+}$, $Ta^{5+}$, $Ta^{4+}$, $Ta^{3+}$, $Ta^{2+}$, $Cr^{6+}$, $Cr^{5+}$, $Cr^{4+}$, $Cr^{3+}$, $Cr^{2+}$, $Cr^+$, $Cr$, $Mo^{6+}$, $Mo^{5+}$, $Mo^{4+}$, $Mo^{3+}$, $Mo^{2+}$, $Mo^+$, $Mo$, $W^{6+}$, $W^{5+}$, $W^{4+}$, $W^{3+}$, $W^{2+}$, $W^+$, $W$, $Mn^{7+}$, $Mn^{6+}$, $Mn^{5+}$, $Mn^{4+}$, $Mn^{3+}$, $Mn^{2+}$, $Mn^+$, $Re^+$, $Re^{6+}$, $Re^{5+}$, $Re^+$, $Re^{3+}$, $Re^{2+}$, $Re^+$, $Re$, $Fe^{6+}$, $Fe^{4+}$, $Fe^{3+}$, $Fe^{2+}$, $Fe^+$, $Fe$, $Ru^{8+}$, $Ru^{7+}$, $Ru^{6+}$, $Ru^{4+}$, $Ru^{3+}$, $Ru^{2+}$, $Os^{8+}$, $Os^{7+}$, $Os^{6+}$, $Os^{5+}$, $Os^{4+}$, $Os^{3+}$, $Os^{2+}$, $Os^+$, $Os$, $Co^{5+}$, $Co^{4+}$, $Co^{3+}$, $Co^{2+}$, $Co^+$, $Rh^{6+}$, $Rh^{5+}$, $Rh^{4+}$, $Rh^{3+}$, $Rh^{2+}$, $Rh+$, $Ir^{6+}$, $Ir^{5+}$, $Ir^{4+}$, $Ir^{3+}$, $Ir^{2+}$, $Ir^+$, $Ir$, $Ni^{3+}$, $Ni^{2+}$, $Ni^+$, $Ni$, $Pd^{6+}$, $Pd^{4+}$, $Pd^{2+}$, $Pd^+$, $Pd$, $Pt^{6+}$, $Pt^{5+}$, $Pt^{4+}$, $Pt^{3+}$, $Pt^{2+}$, $Pt^+$, $Cu^{4+}$, $Cu^{3+}$, $Cu^{2+}$, $Cu^+$, $Ag^{3+}$, $Ag^{2+}$, $Ag^+$, $Au^{5+}$, $Au^{4+}$, $Au^{3+}$, $Au^{2+}$, $Au^+$, $Zn^{2+}$, $Zn^+$, $Zn$, $Cd^{2+}$, $Cd^+$, $Hg^{4+}$, $Hg^{2+}$, $Hg^+$, $B^{3+}$, $B^{2+}$, $B^+$, $Al^{3+}$, $Al^{2+}$, $Al^+$, $Ga^{3+}$, $Ga^{2+}$, $Ga^+$, $In^{3+}$, $In^{2+}$, $In^{1+}$, $Tl^{3+}$, $Tl^+$, $Si^{4+}$, $Si^{3+}$, $Si^{2+}$, $Si^+$, $Ge^{4+}$, $Ge^{3+}$, $Ge^{2+}$, $Ge^+$, $Ge$, $Sn^{4+}$, $Sn^{2+}$, $Pb^{4+}$, $Pb^{2+}$, $As^{5+}$, $As^{3+}$, $As^{2+}$, $As^+$, $Sb^{5+}$, $Sb^{3+}$, $Bi^{5+}$, $Bi^{3+}$, $Te^{6+}$, $Te^{5+}$, $Te^{4+}$, $Te^{2+}$, $La^{3+}$, $La^{2+}$, $Ce^{4+}$, $Ce^{3+}$, $Ce^{2+}$, $Pr^{4+}$, $Pr^{3+}$, $Pr^{2+}$, $Nd^{3+}$, $Nd^{2+}$, $Sm^{3+}$, $Sm^{2+}$, $Eu^{3+}$, $Eu^{2+}$, $Gd^{3+}$, $Gd^{2+}$, $Gd^+$, $Tb^{4+}$, $Tb^{3+}$, $Tb^{2+}$, $Tb^+$, $Db^{3+}$, $Db^{2+}$, $Ho^{3+}$, $Er^{3+}$, $Tm^{4+}$, $Tm^{3+}$, $Tm^{2+}$, $Yb^{3+}$, $Yb^{2+}$, $Lu^{3+}$ and alloys of any of the foregoing.

4. The method of claim 1, wherein the inorganic is a single or mixed oxide, carbide, nitride, silicate, boride of Ti, W, Si, Zr, Al, Y, Cr, Fe, Pb, Co, or a rare earth element.

5. The method of claim 4, wherein the inorganic is selected from the group consisting of $TiO_2$, $AlO_2$, $Al_2O_3$, $ZrO_2$, SiC, $SiO_2$, SiC, $CeO_2$, and ZnO.

6. The method of claim 1, wherein the metal-inorganic composite comprises Au—Ni—$TiO_2$, Ni—Co—$TiO_2$, Ni—Zn—$Al_2O_3$, or Ni—B—$TiO_2$.

7. The method of claim 1, further comprising removing non-polymerized resin.

8. The method of claim 1, further comprising pyrolizing the sub-micron architectural material to remove organic material.

9. The method of claim 8, wherein the pyrolizing comprises a two-step pyrolysis technique to remove organic material followed by removing oxygen.

10. The method of claim 8, wherein the sub-micron architectural material comprises a metal, a metalloid and/or an inorganic structure having a dimension across an axis of a metal, a metalloid and/or a inorganic strut, beam or joint of less than 1 micron.

* * * * *